United States Patent
Ait Aoudia et al.

(10) Patent No.: US 11,139,866 B2
(45) Date of Patent: Oct. 5, 2021

(54) MACHINE-LEARNING-BASED DETECTION AND RECONSTRUCTION FROM LOW-RESOLUTION SAMPLES

(71) Applicant: NOKIA TECHNOLOGIES OY, Espoo (FI)

(72) Inventors: Faycal Ait Aoudia, Saint-Cloud (FR); Jakob Hoydis, Paris (FR); Paul Tourniaire, Vaucluse (FR); Luc Dartois, Carrières sous Poissy (FR)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/135,748

(22) Filed: Dec. 28, 2020

(65) Prior Publication Data

US 2021/0211163 A1    Jul. 8, 2021

(30) Foreign Application Priority Data

Jan. 8, 2020 (FI) .................................... 20205014

(51) Int. Cl.
    *H04B 7/0413* (2017.01)
(52) U.S. Cl.
    CPC ................................. *H04B 7/0413* (2013.01)
(58) Field of Classification Search
    CPC ... H04B 1/0014; H04B 7/0413; H03M 3/458; H03M 1/201
    See application file for complete search history.

(56) References Cited

U.S. PATENT DOCUMENTS

2020/0076464 A1*   3/2020   Marr .................... H03M 7/3042

OTHER PUBLICATIONS

Office Action and Search Report dated May 27, 2020 corresponding to Finnish Patent Application No. 20205014.
A. Gokceoglu et al., "Spatio-temporal waveform design for multiuser massive MIMO downlink with 1-bit receivers," In: IEEE Journal of Selected Topics in Signal Processing, Mar. 2017, vol. 11, No. 2, pp. 347-362.
O. Dabeer et al., Signal parameter estimation using 1-bit dithered quantization. In: IEEE Transactions on Information Theory, Dec. 2006, vol. 52, No. 2, pp. 5389-5405.
J. Liu et al., "Low-resolution ADCs for wireless communication: a comprehensive survey," In: IEEE Access, Jul. 2019, vol. 7, 34 pages.

(Continued)

*Primary Examiner* — Rahel Guarino
(74) *Attorney, Agent, or Firm* — Squire Patton Boggs (US) LLP

(57) ABSTRACT

According to an aspect, there is provided an apparatus comprising a combiner for combining a received analog signal with an analog dithering signal to produce a combined analog signal, a one-bit analog-to-digital converter for converting the combined analog signal to a combined digital signal, means for performing joint downsampling and feature extraction for the combined digital signal, means for implementing a trained machine-learning algorithm for calculating one or more input parameters for waveform generation at least based on one or more features extracted from the combined digital signal and a parametric waveform generator for generating the analog dithering signal based on the one or more input parameters.

20 Claims, 10 Drawing Sheets

(56) References Cited

OTHER PUBLICATIONS

O. Simeone, "A very brief introduction to machine learning with applications to communications systems," In: IEEE Transactions on Cognitive Communications and Networking, Dec. 2018, vol. 4, No. 4, pp. 648-664.
Communication of Acceptance under section 29a of Patents Decree dated Dec. 8, 2020 corresponding to Finnish Patent Application No. 20205014.
Extended European Search Report dated Jun. 11, 2021 corresponding to European Patent Application No. 21150142.4.
Jinseok Choi et al., "Robust Learning-Based ML Detection for Massive MIMO Systems with One-Bit Quantized Signals," 2019 IEEE Global Communications Conference (GLOBECOM), IEEE, Dec. 9, 2019, pp. 1-6, XP033722124.
Mathieu Goutay et al., "Deep Reinforcement Learning Autoencoder with Noisy Feedback," 2019 International Symposium on Modeling and Optimization in Mobile, Ad Hoc, and Wireless Networks (WIOPT), IFIP, Jun. 3, 2019, pp. 1-6, XP033795910.

\* cited by examiner

MACHINE-LEARNING-BASED DETECTION AND RECONSTRUCTION FROM LOW-RESOLUTION SAMPLES

TECHNICAL FIELD

Various example embodiments relate to wireless communications.

BACKGROUND

Modern communication systems operating using a wide bandwidth and/or using a large number or radio receivers (e.g., MIMO systems) require large amounts of power. One proposed solution for reducing this power consumption is the use of a one-bit analog-to-digital converter (ADC) in the receiver. With a one-bit ADC, each sample has a one-bit resolution and therefore only carries information on the sign of the received signal. The drawback of using one-bit ADCs comes from the difficulty of performing accurate detection or signal reconstruction from the one-bit samples, which only carry information on the sign of the received signal. One-bit quantization leads to the loss of information on the signal amplitude, and only information on the signal phase is preserved. Moreover, the complexity of the digital processing receiver must not overcome the gain obtained through one-bit ADCs.

OKCEOGLU, A. ET AL. Spatio-temporal waveform design for multiuser massive MIMO downlink with 1-bit receivers. In: IEEE Journal of Selected Topics in Signal Processing, March 2017, Vol. 11, No. 2, pp. 347-362 discloses an ap-proach for spatiotemporal waveform design, optimization and detection for mul-tiuser massive MIMO downlink with 1-bit receivers using 1-bit ADCs with oversampling. Specifically, use of a two-stage precoding structure, namely, a novel quantization precoder followed by maximum-ratio transmission or zero-forcing-type spatial channel precoder which jointly form the multiuser multiantenna transmit waveform, is suggested for a transmitter for transmission to said 1-bit receivers.

BRIEF DESCRIPTION

According to an aspect, there is provided the subject matter of the independent claims. Embodiments are defined in the dependent claims. The scope of protection sought for various embodiments of the invention is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

In the following, different exemplifying embodiments will be described using, as an example of an access architecture to which the embodiments may be applied, a radio access architecture based on long term evolution advanced (LTE Advanced, LTE-A) or new radio (NR, 5G), without restricting the embodiments to such an architecture, however. It is obvious for a person skilled in the art that the embodiments may also be applied to other kinds of communications networks having suitable means by adjusting parameters and procedures appropriately. Some examples of other options for suitable systems are the universal mobile telecommunications system (UMTS) radio access network (UTRAN or E-UTRAN), long term evolution (LTE, the same as E-UTRA), wireless local area network (WLAN or WiFi), worldwide interoperability for microwave access (WiMAX), Bluetooth®, personal communications services (PCS), ZigBee®, wideband code division multiple access (WCDMA), systems using ultra-wideband (UWB) technology, sensor networks, mobile ad-hoc networks (MANETs) and Internet Protocol multimedia subsystems (IMS) or any combination thereof.

Figure 1:
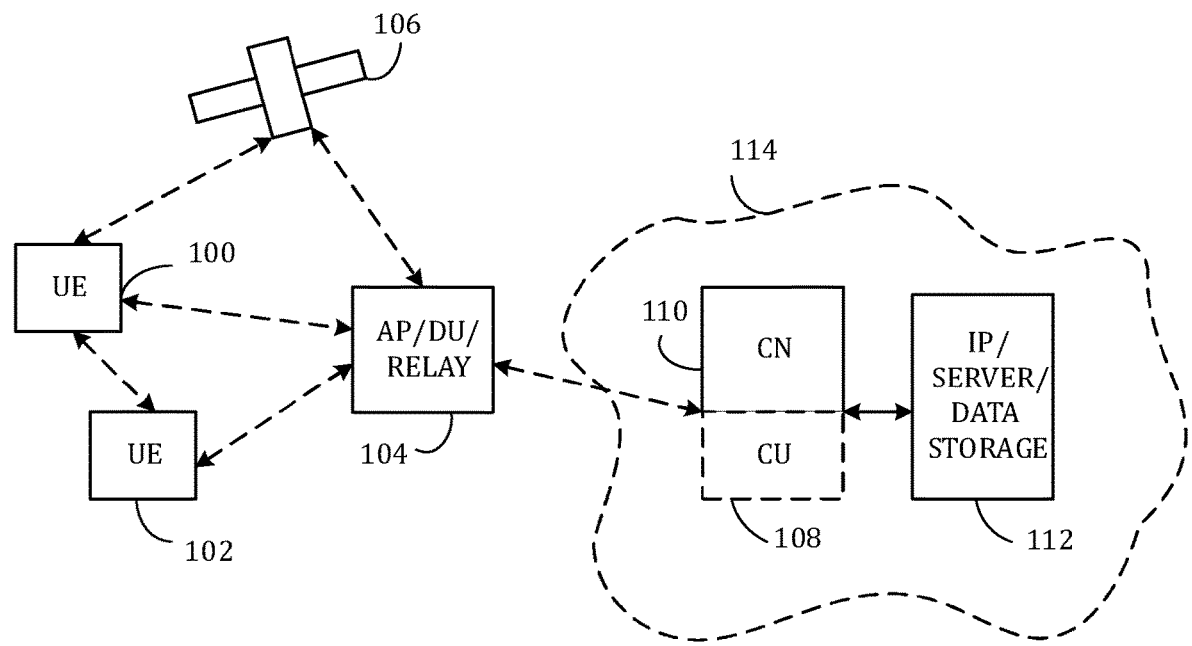
FIG. 1 illustrates an exemplified wireless communication system.

FIG. 1 depicts examples of simplified system architectures only showing some elements and functional entities, all being logical units, whose implementation may differ from what is shown. The connections shown in FIG. 1 are logical connections; the actual physical connections may be different. It is apparent to a person skilled in the art that the system typically comprises also other functions and structures than those shown in FIG. 1.

The embodiments are not, however, restricted to the system given as an example but a person skilled in the art may apply the solution to other communication systems provided with necessary properties.

The example of FIG. 1 shows a part of an exemplifying radio access network.

FIG. 1 shows user devices 100 and 102 (equally called terminal devices) configured to be in a wireless connection on one or more communication channels in a cell with an access node (such as (e/g)NodeB) 104 providing the cell. The physical link from a user device to a (e/g)NodeB is called uplink or reverse link and the physical link from the (e/g)NodeB to the user device is called downlink or forward link. It should be appreciated that (e/g)NodeBs or their functionalities may be implemented by using any node, host, server or access point etc. entity suitable for such a usage.

A communications system typically comprises more than one (e/g)NodeB in which case the (e/g)NodeBs may also be configured to communicate with one another over links, wired or wireless, designed for the purpose. These links may be used for signalling purposes. The (e/g)NodeB is a computing device configured to control the radio resources of communication system it is coupled to. The NodeB may also be referred to as a base station, an access point or any other type of interfacing device including a relay station capable of operating in a wireless environment. The (e/g)NodeB includes or is coupled to transceivers. From the transceivers of the (e/g)NodeB, a connection is provided to an antenna unit that establishes bi-directional radio links to user devices. The antenna unit may comprise a plurality of antennas or antenna elements. The (e/g)NodeB is further connected to core network 110 (CN or next generation core NGC). Depending on the system, the counterpart on the CN side can be a serving gateway (S-GW, routing and forwarding user data packets), packet data network gateway (P-GW), for providing connectivity of user devices (UEs) to external packet data networks, or mobile management entity (MME), etc.

The user device (also called UE, user equipment, user terminal or terminal device) illustrates one type of an apparatus to which resources on the air interface are allocated and assigned, and thus any feature described herein with a user device may be implemented with a corresponding apparatus, such as a relay node. An example of such a relay node is a layer 3 relay (self-backhauling relay) towards the base station.

The user device typically refers to a portable computing device that includes wireless mobile communication devices operating with or without a subscriber identification module (SIM), including, but not limited to, the following types of devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a user device may also be a nearly exclusive uplink only device, of which an example is a camera or video camera loading images or video clips to a network. A user device may also be a device having capability to operate in Internet of Things (IoT) network which is a scenario in which objects are provided with the ability to transfer data over a network without requiring human-to-human or human-to-computer interaction. The user device (or in some embodiments a layer 3 relay node) is configured to perform one or more of user equipment functionalities. The user device may also be called a subscriber unit, mobile station, remote terminal, access terminal, user terminal or user equipment (UE) just to mention but a few names or apparatuses.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question has inherent mobility, are a subcategory of cyber-physical systems. Examples of mobile physical systems include mobile robotics and electronics transported by humans or animals.

It should be understood that, in FIG. 1, user devices are depicted to include 2 antennas only for the sake of clarity. The number of reception and/or transmission antennas may naturally vary according to a current implementation.

Additionally, although the apparatuses have been depicted as single entities, different units, processors and/or memory units (not all shown in FIG. 1) may be implemented.

5G enables using multiple input-multiple output (MIMO) antennas, many more base stations or nodes than the LTE (a so-called small cell concept), including macro sites operating in co-operation with smaller stations and employing a variety of radio technologies depending on service needs, use cases and/or spectrum available. 5G mobile communications supports a wide range of use cases and related applications including video streaming, augmented reality, different ways of data sharing and various forms of machine type applications, including vehicular safety, different sensors and real-time control. 5G is expected to have multiple radio interfaces, namely below 6 GHz, cmWave and mmWave, and also being integradable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz-cmWave, below 6 GHz-cmWave-mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The current architecture in LTE networks is fully distributed in the radio and fully centralized in the core network. The low latency applications and services in 5G require to bring the content close to the radio which leads to local break out and multi-access edge computing (MEC). 5G enables analytics and knowledge generation to occur at the source of the data. This approach requires leveraging resources that may not be continuously connected to a network such as laptops, smartphones, tablets and sensors. MEC provides a distributed computing environment for application and service hosting. It also has the ability to store and process content in close proximity to cellular subscribers for faster response time. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system is also able to communicate with other networks, such as a public switched telephone network or the Internet 112, or utilize services provided by them. The communication network may also be able to support the usage of cloud services, for example at least part of core network operations may be carried out as a cloud service (this is depicted in FIG. 1 by "cloud" 114). The communication system may also comprise a central control entity, or a like, providing facilities for networks of different operators to cooperate for example in spectrum sharing.

Edge cloud may be brought into radio access network (RAN) by utilizing network function virtualization (NVF) and software defined networking (SDN). Using edge cloud may mean access node operations to be carried out, at least partly, in a server, host or node operationally coupled to a remote radio head or base station comprising radio parts. It is also possible that node operations will be distributed among a plurality of servers, nodes or hosts. Application of cloudRAN architecture enables RAN real time functions being carried out at the RAN side (in a distributed unit, DU 104) and non-real time functions being carried out in a centralized manner (in a centralized unit, CU 108).

It should also be understood that the distribution of labor between core network operations and base station operations may differ from that of the LTE or even be non-existent. Some other technology advancements probably to be used are Big Data and all-IP, which may change the way networks are being constructed and managed. 5G (or new radio, NR) networks are being designed to support multiple hierarchies, where MEC servers can be placed between the core and the base station or nodeB (gNB). It should be appreciated that MEC can be applied in 4G networks as well.

5G may also utilize satellite communication to enhance or complement the coverage of 5G service, for example by providing backhauling. Possible use cases are providing service continuity for machine-to-machine (M2M) or Internet of Things (IoT) devices or for passengers on board of vehicles, or ensuring service availability for critical communications, and future railway/maritime/aeronautical communications. Satellite communication may utilize geostationary earth orbit (GEO) satellite systems, but also low earth orbit (LEO) satellite systems, in particular mega-constellations (systems in which hundreds of (nano)satellites are deployed). Each satellite 106 in the mega-constellation may cover several satellite-enabled network entities that create on-ground cells. The on-ground cells may be created through an on-ground relay node 104 or by a gNB located on-ground or in a satellite.

It is obvious for a person skilled in the art that the depicted system is only an example of a part of a radio access system and in practice, the system may comprise a plurality of (e/g)NodeBs, the user device may have an access to a plurality of radio cells and the system may comprise also other apparatuses, such as physical layer relay nodes or other network elements, etc. At least one of the (e/g)NodeBs or may be a Home(e/g)nodeB. Additionally, in a geographical area of a radio communication system a plurality of different kinds of radio cells as well as a plurality of radio cells may be provided. Radio cells may be macro cells (or umbrella cells) which are large cells, usually having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. Typically, in multilayer networks, one access node provides one kind of a cell or cells, and thus a plurality of (e/g)NodeBs are required to provide such a network structure.

For fulfilling the need for improving the deployment and performance of communication systems, the concept of "plug-and-play" (e/g)NodeBs has been introduced. Typically, a network which is able to use "plug-and-play" (e/g)Node Bs, includes, in addition to Home (e/g)NodeBs (H(e/g)nodeBs), a home node B gateway, or HNB-GW (not shown in FIG. 1). A HNB Gateway (HNB-GW), which is typically installed within an operator's network may aggregate traffic from a large number of HNBs back to a core network.

Modern communication systems operating using a wide bandwidth and/or using a large number or radio receivers (e.g., MIMO systems) require large amounts of power. One proposed solution for reducing this power consumption is the use of a one-bit analog-to-digital converter (ADC) in the receiver. With a one-bit ADC, each sample has a one-bit resolution and therefore only carries information on the sign of the received signal. The drawback of using one-bit ADCs comes from the difficulty of performing accurate detection or signal reconstruction from the one-bit samples, which only carry information on the sign of the received signal. One-bit quantization leads to the loss of information on the signal amplitude, and only information on the signal phase is preserved. Moreover, the digital processing receiver must be designed so that the complexity of the digital processing receiver does not overcome the gain obtained through the use of one-bit ADCs.

The embodiments seek to overcome or at least to alleviate at least some of the problems described above by adding to the received (band-limited) radio frequency (RF) analog signal a dithering signal. Said dithering signal is specifically calculated, in the receiver, in a feedback loop comprising a function with trainable parameters from previously received samples.

At least some of the embodiments to be discussed below in detail are based on training an artificial neural network (NN) such as a recurrent neural network and subsequently using said trained neural network for dynamic waveform generation (i.e., for generating a dithering signal to be combined with a received radio frequency signal). To facilitate the following detailed discussion on the embodiments based on neural networks, neural network are discussed here briefly in general.

The embodiments may employ one or more neural networks for machine learning. Neural networks (or specifically artificial neural networks) are computing systems comprised of highly interconnected "neurons" capable of information processing due to their dynamic state response to external inputs. In other words, an artificial neural network is an interconnected group of nodes (or "neurons"), where each connection between nodes is associated with a weight (i.e., a weighting factor), the value of which affects the strength of the signal at said connection and thus also the total output of the neural network. Usually, a bias term is also added to the total weighted sum of inputs at a node. Training of a neural network typically involves adjusting said weights and biases so as to match a known output given a certain known input. The one or more neural networks employed in embodiments may comprise one or more feedforward neural networks and/or one or more recurrent neural networks.

An example of a feedforward neural network which may be employed in embodiments is a multilayer perceptron model or network which is a network of simple perceptrons. A single layer perceptron can be used to learn linearly separable functions but cannot be used to perform complex tasks like learning a non-linear decision boundary in classification. On the other hand, a multilayer perceptron network, which uses two or more layers of perceptrons, may be used to learn complex functions and highly non-linear decision boundaries. A multilayer perceptron network is a basic form a feedforward neural network and typically consists of an input layer, one or more hidden layers and an output layer. The network uses forward passes and back-propagation to learn the weights and bias. Forward passes (from input to output) calculate the outputs, while back-propagation calculates the necessary updates for the weights and biases based on the error at the output layer.

Feedforward neural networks do not have the capability to store any information since there are no loops in feedforward neural networks. Recurrent neural networks (RNNs), on the other hand, have loops in them allowing information to be maintained. One example of a recurrent neural network which may be employed in embodiments is a long short term memory (LSTM) which is a special type of recurrent neural network specialized in learning long-term dependencies. A single LSTM cell consists of three gates (input, output and forget gate) and a memory cell. Gates act as regulators of information and help LSTM cells to remove old information or add new information. The extent to which the existing memory is forgotten is controlled by the forget gate. Another example of a recurrent neural network which may be employed in embodiments and which is also capable of learning long-term dependencies is a gated recurrent unit (GRU). While long short term memories employ three gates, there are only two gates in a GRU (called reset and update gate) which makes gated recurrent units simpler and faster than long short term memories. Other recurrent neural networks may also be employed in connection with embodiments. The used recurrent neural network may specifically be finite impulse recurrent network, that is, a recurrent neural network which can be unfolded or unrolled and thus replaced with one or more copies of a feedforward neural network.

Figure 2:
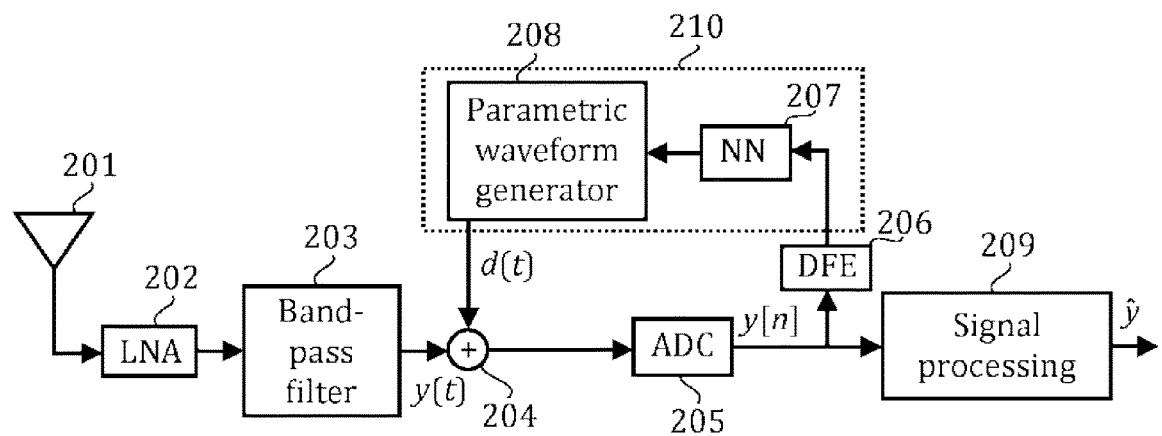
FIGS. 2, 4 and 6A illustrate system architectures according to embodiments.

FIG. 2 illustrates a system according to embodiments for receiving and processing a RF signal. The illustrated system may correspond to or be comprised in a receiver or a transceiver. The illustrated system may be comprised in an access or a relay node such as the access or relay node 104 of FIG. 1 or in a terminal device such as either of the terminal devices 100, 102.

Referring to FIG. 2, the system comprises, similar to a conventional RF receiver, at least one antenna 201 followed by at least one amplifier 202 (preferably, a low-noise amplifier) and at least one (RF) filter 203 (preferably, a band-pass filter). These elements 201, 202, 203 are used for receiving and pre-processing an analog RF signal transmitted by a transmitter. The at least one antenna 201 used for receiving or capturing the RF signal propagating in free space (e.g., in air) may be of any known antenna type. Similarly, the at least one amplifier 202 and the at least one filter 203 may be any used conventional amplifier and filter elements used in receivers. In some embodiments, the order of the amplifier 202 and the band-pass filter 203 in the receiver chain may be different.

After the received analog RF signal has been amplified and filtered in elements 202, 203 resulting in a received (pre-processed) analog signal y(t), said received analog signal is combined with an analog dithering signal d(t) produced by a parametric waveform generator 208 in a combiner 204 (or more specifically in a RF power combiner). The analog dithering signal may be, for example, a sine wave or a combination (e.g., a sum) of two or more sine waves (having potentially different amplitudes, frequencies and/or phases). According to a general definition, a combiner is an RF component (usually but not always passive) used for combining RF signals. The dithering of the received analog signal in element 204 serves to minimize quantization errors in subsequent analog-to-digital conversion (in element 205). The operation of the parametric waveform generator 208 is governed by a feedback loop formed by elements 204 to 208. Said operation and the properties of the analog dithering signal are to be discussed in detail later.

The combined analog signal produced by the combiner 204 is fed to an analog-to-digital converter (ADC) 205 which converts said combined analog signal to a combined digital signal. The analog-to-digital converter 205 may specifically be a one-bit analog-to-digital converter, that is, an analog-to-digital converter whose output is a digital signal with one-bit resolution. The analog-to-digital converter 205 produces a combined digital signal y[n] which, in the case of a one-bit analog-to-digital converter is defined to have values y[n]∈{0,1} for all n. In the case of a one-bit analog-to-digital converter, the combined one-bit digital signal is able to only carry information on the phase of the received analog signal y[n] (i.e., the information regarding the signal amplitude is lost). The phase may be determined from a one-bit digital signal based on zero-to-one transitions and/or one-to-zero transitions of said one-bit digital signal. However, the calculation of the phase based on a one-bit digital signal is very sensitive to noise in the received RF signal as said noise may easily cause the value of the one-bit digital signal to flip from one to zero or from zero to one. The purpose of applying of the dithering signal (in element 204) is to minimize these errors.

The combined digital signal y[n] is fed to a downsampling and feature extraction element or unit (DFE) 206 which performs joint downsampling and feature extraction for the combined digital signal. The DFE 206 may extract features periodically from samples fed to it (i.e., from y[n]) over a pre-defined time window so as to perform the downsampling. In other words, a sequence y[n−W+1], y[n−W+2], . . . , y[n] may be processed in the DFE 206 (during a single processing instance), where W is a width of the pre-defined time window in samples. For example, the analog-to-digital converter may run at 30 GHz whereas the downsampling and feature extraction may be done so that the rest of the elements in the feedback loop (indicated as element 210) may run at a downsampled rate of 30 kHz. In other words, downsampling by a factor $10^6$ may be performed, leading to significantly lowered processing needs. Obviously, embodiments are not limited to these particular frequency values or this particular downsampling factor. In some embodiments, the downsampling may be performed using a factor of at least $10^3$, $10^4$, $10^5$ or $10^6$.

Feature extraction is defined as a process of dimensionality reduction in which an initial set of raw data (here, the combined digital signal) is reduced to a smaller set of data for further processing. The reduced set of data is ideally defined such that it is informative and non-redundant (i.e., captures the essential properties of the set of raw data in a concise way). A feature is defined, generally, as a variable used as an input of a machine-learning algorithm. Specifically, said variables are predictor variables believed to contain data for predicting one or more outcome variables (here, one or more input parameters of the parametric waveform generator 208). The one or more features may comprise, for example, the number of certain amplitude transitions (e.g., transition from zero amplitude to smallest non-zero amplitude or vice versa).

Assuming that the analog-to-digital converter 205 is a one-bit analog-to-digital converter, the one or more features extracted from the (one-bit) combined digital signal may comprise one or more of the following:

the number of zero-to-one transitions in the combined digital signal;

the number of one-to-zero transitions in the combined digital signal;

a ratio of zero-to-one and one-to-zero transitions in the combined digital signal;

a difference between the number of zero-to-one transitions and the number of zero-to-one transitions in the combined digital signal;

a second order moment of the combined digital signal (applicable also for other ADCs);

noise energy in the combined digital signal (applicable also for other ADCs); and energy (in the combined digital signal) resulting from interference on adjacent channels (applicable also for other ADCs).

A zero-to-one transition corresponds a change or switch of the value of a one-bit digital signal (here, the one-bit combined digital signal) from zero to one. A one-to-zero transition corresponds a change or switch of the value of a one-bit digital signal (here, the one-bit combined digital signal) from one to zero. The second order moment may be equally called a second moment. The noise energy in the combined digital signal may correspond to the energy of background noise (unwanted signal component) in the combined digital signal. The energy resulting from interference on adjacent channels may correspond adjacent-channel interference (ACI) which is defined as interference caused by extraneous power from a signal in an adjacent channel (or in general one or more adjacent channels).

As indicated above, the one or more extracted features are used as an input of a machine-learning algorithm implemented in element 207. Here, it is assumed that the machine-learning algorithm is already trained. The training of the machine-learning algorithm is discussed below in relation to FIGS. 4, 5, 6A, 6B and 7. The trained machine-learning algorithm is used, in element 207, for calculating one or more input parameters for waveform generation at least based on the one or more features extracted from the combined digital signal by DFE 206. The trained machine-learning algorithm 207 may have been trained specifically for optimizing the performing of signal processing in element 209. The machine-learning algorithm may be a neural network (NN) (or a neural network-based algorithm employing using one or more neural networks), as illustrated in FIG. 2. Said one or more neural networks may comprise one or more feedforward neural networks and/or one or more recurrent neural networks.

Said one or more input parameters are fed to the parametric waveform generator 208 which generates the analog dithering signal d (t) (which is subsequently combined in the combiner 204) based on the one or more input parameters. As mentioned above, the analog dithering signal may be, for example, a sine wave or a combination (e.g., a sum) of two or more sine waves. At least some of said two or more sine waves may have different frequencies, amplitudes and/or (relative) phases. In some embodiments, the one or more input parameters of the parametric waveform generator 208 may comprise at least an amplitude of at least one sine wave. Additionally or alternatively, the one or more input parameters of the parametric waveform generator 208 may comprise at least a frequency of at least one sine wave and/or a phase of at least one sine wave. To give a simple example, the analog dithering signal may be a sine wave whose amplitude and frequency are input parameters of the parametric waveform generator 208 calculated using a neural network 207 with optimized weights.

The combined digital signal y[n] produced by the analog-to-digital converter 205 is also fed to subsequent radio processing stages (here, a signal processing element or unit or stage 209). The signal processing element 209 may be specifically a signal reconstruction element 209 which reconstructs the received analog signal (i.e., signal y(t)) as a digital signal ŷ having a resolution higher than the resolution of the combined digital signal based on the combined digital signal (i.e., signal y[n]). For example, the combined digital signal may be a one-bit digital signal while the digital signal produced by the signal reconstruction element 209 may be a 8-bit or 12-bit digital signal or other high-resolution digital signal (e.g., a signal having at least 8-bit resolution) providing a close approximation of the analog waveform of the original received signal. The signal reconstruction element 209 may comprise, for example, at least one digital band-pass filter. Assuming the use of a one-bit ADC, the combined digital signal corresponds to a combination of one or more square waves. Said at least one digital band-pass filter may be used to filter out the higher harmonic frequencies (i.e., 3f, 5f, 7f, . . . ) of each square wave so as to leave only the first harmonic frequency f, i.e., to leave only a single sinusoidal wave.

In other embodiments, the signal processing element 209 may be specifically a bit-symbol demapping element 209 (or equally a bit-to-symbol demapping element 209). The bit-symbol demapping element 209 may perform bit-to-symbol demapping (i.e., symbol-to-bit mapping) on the combined digital signal y[n]. In other words, the bit-symbol demapping element 209 converts a stream of complex symbols in the combined digital signal y[n] (corresponding to a stream of complex symbols transmitted by a transmitter) to a corresponding bit stream. Each complex symbol in the combined digital signal y[n] may be mapped to a group of bits.

In some embodiments, the signal reconstruction element 209 may be omitted altogether.

The trained machine-learning algorithm implemented in element 207 may have been trained specifically for optimal signal reconstruction or optimal bit-symbol demapping, depending on the signal processing element implemented in element 209. In some embodiments, the trained machine-learning algorithm implemented in element 207 may have been trained simultaneously for both optimal signal reconstruction or optimal bit-symbol demapping.

Figure 3A:
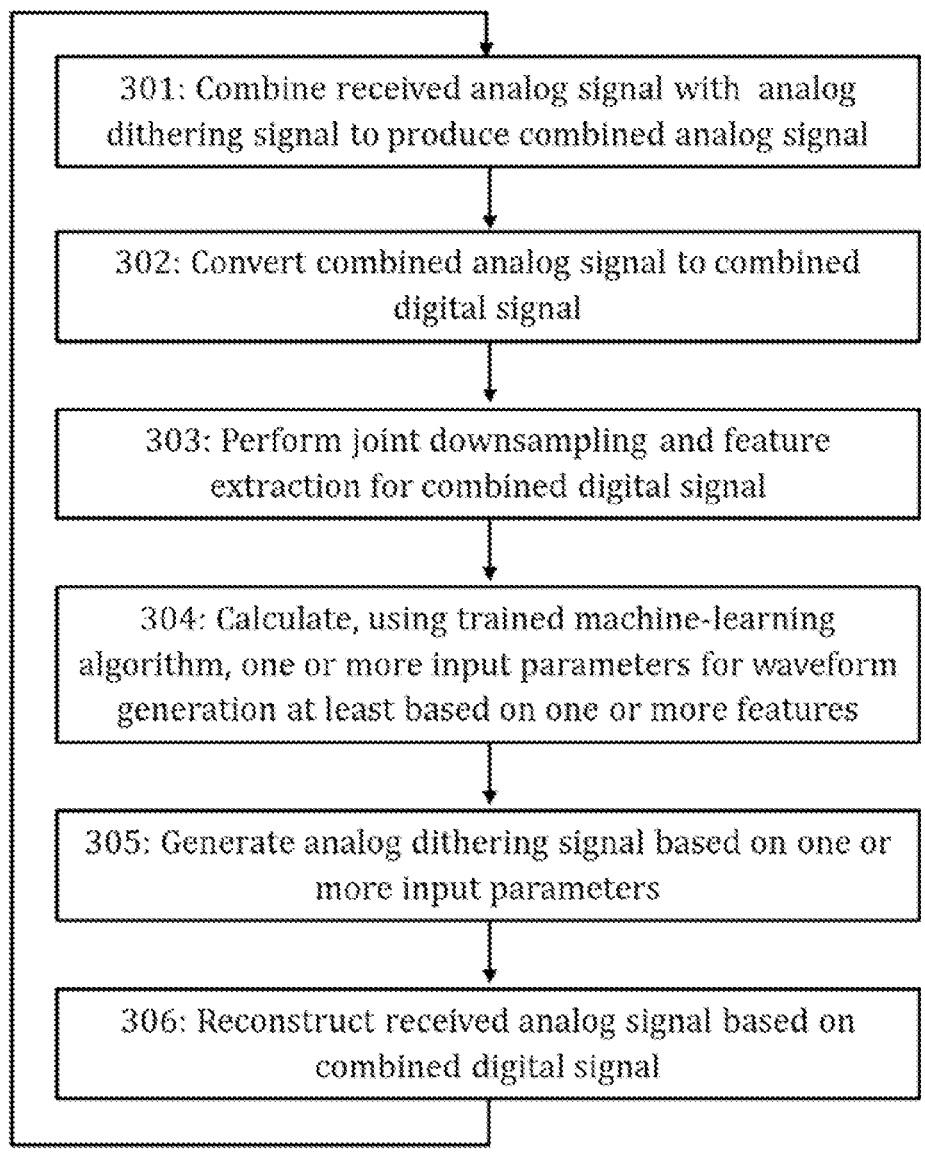
FIGS. 3A, 3B, 5, 6B and 7 illustrate exemplary processes according to embodiments.

FIG. 3A illustrates a process according to embodiments for processing a received analog signal. The process of FIG. 3A may be carried out, for example, using the system architecture of FIG. 2 or specifically by at least elements 204 to 208, 209 therein. The illustrated process may be carried out by a receiver or a transceiver or by an apparatus (or a sub-unit) comprised in a receiver or a transceiver. The illustrated process may be carried out by an apparatus comprised in an access or a relay node such as the access or relay node 104 of FIG. 1 or in a terminal device such as either of the terminal devices 100, 102. In the following, the entity carrying out process is called simply an apparatus.

Referring to FIG. 3A, the apparatus combines, in block 301, a received analog signal with an analog dithering signal to produce a combined analog signal. The received analog signal may have been received from an unguided transmission medium (i.e., from free space) via an antenna and one or more pre-processing elements (e.g., an amplifier and a filter) as illustrated in FIG. 2. In other embodiments, the received analog signal may have been received from a guided transmission medium (e.g., an optical fiber or a coaxial cable). The apparatus converts, in block 302, the combined analog signal to a combined digital signal (e.g., to a combined one-bit digital signal). The apparatus performs, in block 303, joint downsampling and feature extraction for the combined digital signal and calculates, in block 304, using a trained machine-learning algorithm (e.g., based on one or more trained neural networks), one or more input parameters for waveform generation at least based on one or more features extracted from the combined digital signal. The apparatus generates, in block 305, the analog dithering signal based on the one or more input parameters. Thus, a feedback loop is formed (as illustrated by elements 204 to 208 of FIG. 2). The apparatus reconstructs, in block 306, the received analog signal as a digital signal based on the combined digital signal, where said digital signal has a higher resolution than the combined digital signal.

Figure 3B:
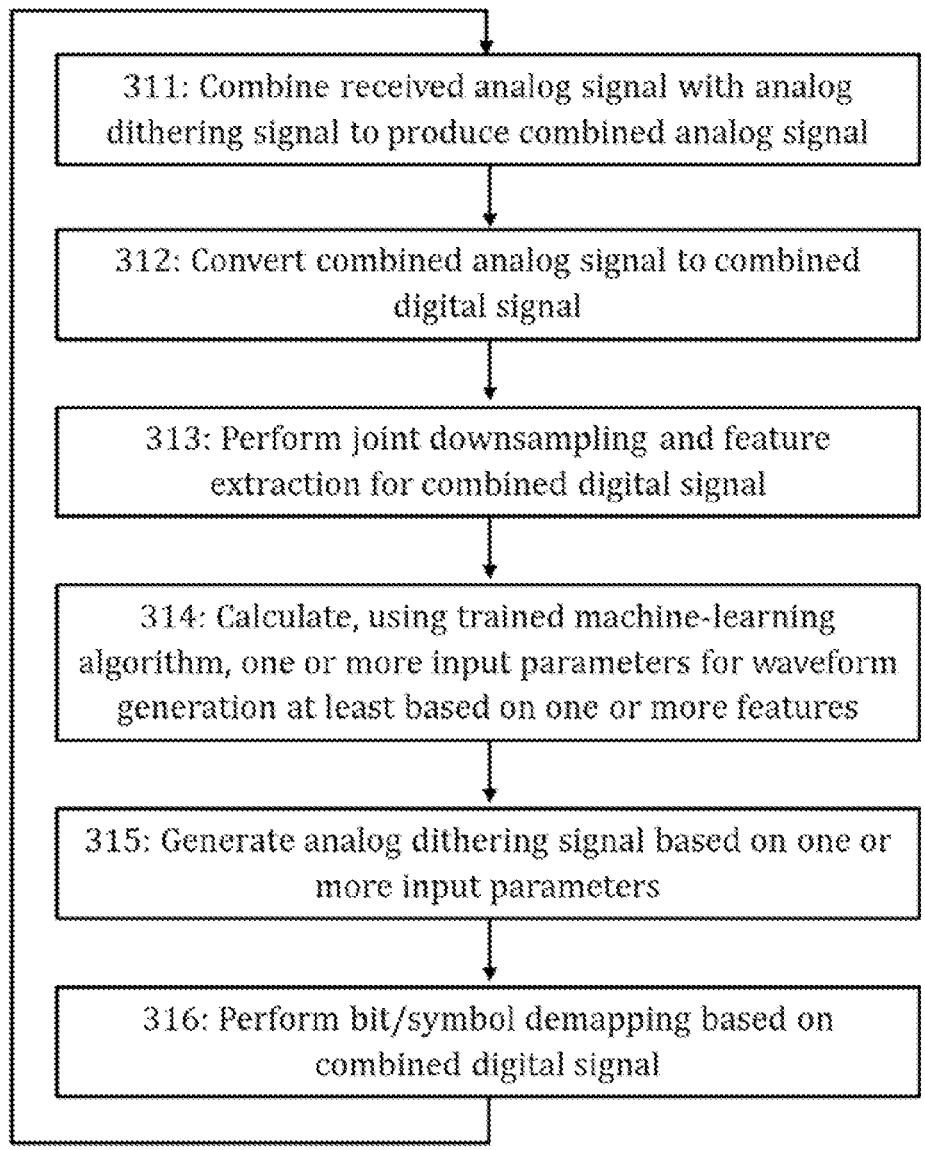

FIG. 3B illustrates an alternative process according to embodiments for processing a received analog signal. The process of FIG. 3A may be carried out, for example, using the system architecture of FIG. 2 or specifically by at least elements 204 to 208, 209 therein. The illustrated process may be carried out by a receiver or a transceiver or by an apparatus (or a sub-unit) comprised in a receiver or a transceiver. The illustrated process may be carried out by an apparatus comprised in an access or a relay node such as the access or relay node 104 of FIG. 1 or in a terminal device such as either of the terminal devices 100, 102. In the following, the entity carrying out process is called simply an apparatus.

FIG. 3B may correspond fully to FIG. 3A apart from the final step of the illustrated process (i.e., block 317). In other words, blocks 311 to 316 may correspond fully to blocks 301 to 306 of FIG. 3A and are thus not repeated here for brevity. The difference between the two processes lies solely in how the combined digital signal is employed. In FIG. 3B, the apparatus performs, in block 317, bit-to-symbol demapping (i.e., symbol-to-bit mapping) on the combined digital signal.

Any of the additional features (e.g., actions relating to any of elements 201 to 203) or more detailed definitions (e.g., for said one or more features and/or the analog dithering signal) discussed in relation to FIG. 2 may also be applied, in an equivalent manner, for the processes of FIGS. 3A and 3B.

At least some of the actions described in relation to blocks 301 to 306 and blocks 311 to 316 may be carried out in parallel or in different order than is illustrated in FIGS. 3A and 3B.

In some embodiments, the process may comprise only actions pertaining to blocks 303 to 306, blocks 303 to 305, blocks 313 to 316 or blocks 313 to 315. Such embodiments may be carried out solely by a computing device comprising at least one processor and at least one memory. According to an embodiment, there is provided a computer program comprising instructions stored thereon for performing at least actions pertaining to blocks 303 to 306, blocks 303 to 305, blocks 313 to 316 or blocks 313 to 315.

Figure 4:
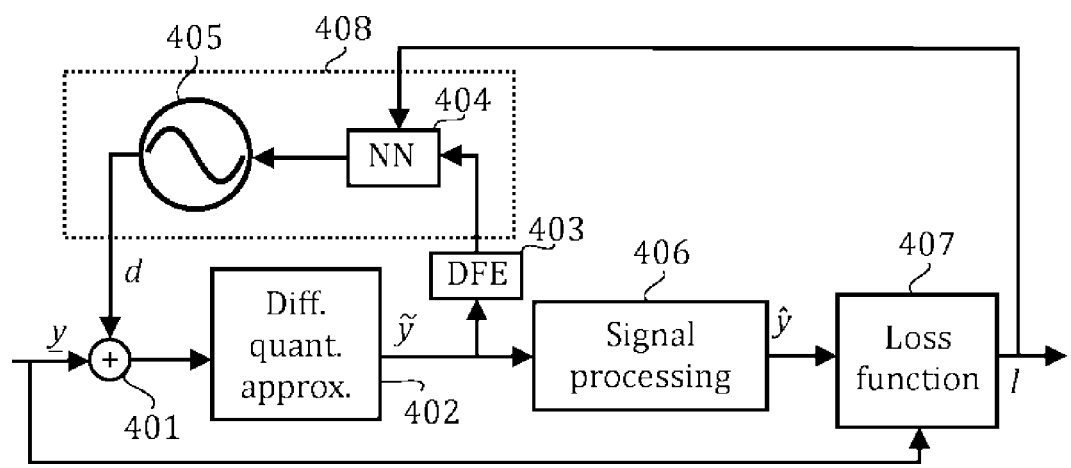

FIG. 4 illustrates a system according to embodiments for training a machine-learning algorithm. Specifically, the machine-learning algorithm may be a machine-learning algorithm as discussed in relation to FIGS. 2, 3A and 3B. The illustrated system may correspond to or be comprised in a receiver or a transceiver. The illustrated system may be comprised in an access or a relay node such as the access or relay node 104 of FIG. 1 or in a terminal device such as either of the terminal devices 100, 102. The illustrated system may be implemented in a computing device comprising at least one processor and at least one memory.

While the system illustrated in FIG. 4 is to a large extent analogous with the system of FIG. 2, some differences exist between the two systems so as to enable training of the machine-learning algorithm offline fully in the digital domain. Specifically, the system illustrated in FIG. 2 is not trainable as it includes an analog-to-digital converter. Backpropagating gradients through this component, and therefore training, cannot be done with conventional stochastic gradient descent (SGD) methods. To circumvent this issue, the system of FIG. 4 used for training corresponds to a differentiable approximation of the system of FIG. 2 (with some additional functionalities enabling the training of the machine-learning algorithm). Consequently, most of the definitions provided in relation to FIG. 2 apply also for FIG. 4 and the emphasis in the following discussion is placed on the differences between the two systems.

Referring to FIG. 4, a received digital signal $\underline{y}$ is, initially, combined, in a (digital) combining element 401, with a digital dithering signal d to produce a first combined digital signal. The received digital signal $\underline{y}$ may be a digital equivalent of the received analog signal y(t) of FIG. 2, that is, the received digital signal $\underline{y}$ may imitate the received analog signal in the digital domain. Correspondingly, the digital dithering signal d may be a digital equivalent of the analog dithering signal d(t) discussed in relation of FIG. 2 (e.g., a digital approximation of a sine wave or a sum of two or more sine waves). To accurately approximately the analog received signal with a digital signal, the received digital signal should preferably have a high resolution (e.g., at least 8 bit resolution). A dataset of the received digital signal $\underline{y}$ may have been generated, for example, by experimentally sampling received signals (that is, analog signals received from a transmitter as real online measurements) at the Nyquist rate and preferably with a high resolution. The high resolution may be defined, here and in the following, as a resolution of 8 bits or higher, a resolution of 12 bits or higher or a resolutions of 16 bits or higher. Alternatively, a dataset of the received digital signal $\underline{y}$ may have been generated by experimentally sampling received signals (that is, analog signals received via real online measurements) using a sampling rate higher than the Nyquist rate and preferably with a high resolution. In this latter case, the dataset of the received digital signal $\underline{y}$ may have also been numerically augmented (i.e., the number of samples in the dataset may have been increased numerically based on existing data in the data set). Oversampling may specifically be employed in connection with one-bit analog-to-digital converters (i.e., one-bit receivers). The resulting high resolution samples are denoted by $\underline{y}$. Alternatively, the dataset of the received digital signal $\underline{y}$ may have been generated by performing simulations of a radio channel.

A plurality of datasets of received digital signals may be maintained in a memory of the apparatus. Optionally, also datasets relating to transmitted digital signal (e.g., the transmitted digital signal itself and/or bits comprised in the transmitted digital signal) may be maintained in said memory.

A differentiable approximation of a quantization operator (or equally a differentiable quantization operator) is applied, in element 402, to the combined digital signal to form a second combined digital signal $\tilde{y}$ with a (significantly) lowered resolution compared to the first combined digital signal. Specifically, the differentiable approximation of the quantization operator 402 may be used to approximate an analog-to-digital converter (or specifically the analog-to-digital converter 205 of FIG. 2) in digital domain.

The differentiable approximation of the quantization operator 402 may approximate a one-bit analog-to-digital converter and thus, similar to as described in relation to above embodiments, the second combined digital signal $\tilde{y}$ may be a one-bit digital signal. Thus, the differentiable approximation of the quantization operator may convert the first combined digital signal having high resolution (e.g., 8 or 12 bit resolution) to a second combined digital signal $\tilde{y}$ having a one-bit resolution. The differentiable approximation of the quantization operator may approximate operation of the one-bit analog-to-digital converter by implementing a function approximating a signum function. Specifically, the following approximation of one-bit quantization may be employed in element 402:

$$\tilde{y} = \tanh\left(\frac{y}{\tau}\right),$$

where $\tau$ is a positive parameter controlling the accuracy of the approximation. As $\tau$ decreases, the accuracy of the approximation increases. However, if a small $\tau$ is used at the outset, problems with stability may be encountered. To overcome this issue, in some embodiments, $\tau$ may have a pre-defined initial value (e.g., one or some other "large"

value) which is progressively reduced during the training of the machine-learning algorithm. In other embodiments, τ may have a single (static) pre-defined value.

The elements 403, 404, 405 may operate in a similar manner as described for the corresponding elements 206, 207, 208 of FIG. 2. Any features described in relation to elements 206, 207, 208 apply in a corresponding manner for the elements 403, 404, 405 (unless otherwise stated). Accordingly, the downsampling and feature extraction element 403 performs joint downsampling and feature extraction for the second combined digital signal. Then, one or more input parameters for waveform generation are calculated, using a machine-learning algorithm in element 404, at least based on one or more features extracted from the second combined digital signal. The machine-learning algorithm may be based on one or more neural networks. As the system uses the output of the neural network 404 from the previous time step in generating an input for the neural network of the current time step, the neural network used may be specifically a type of recurrent neural network. The machine-learning algorithm (i.e., the neural network) is trained periodically or continuously as will be described below. Finally, the parametric waveform generation element 405, which is a fully digital parametric waveform generator approximating the operation of a parametric waveform generator 208 of FIG. 2, generates the digital dithering signal d based on the one or more input parameters. As mentioned above, the digital dithering signal d may correspond to, for example, a digital approximation of a sine wave or a combination (e.g., a sum) of two or more sine waves. In some embodiments, the one or more input parameters of the parametric waveform generation element 405 may comprise at least an amplitude of at least one sine wave. Similar to as described for the system of FIG. 2, the element 408 illustrates elements which operate using a downsampled rate (or frequency).

The second combined digital signal ỹ produced by the differentiable approximation of the quantization operator 402 is also fed to subsequent radio processing stages (here, a signal processing element or unit or stage 406). The signal processing element 406 may correspond to the signal processing element 209 of FIG. 2 (i.e., to a signal reconstruction element or a bit-to-symbol demapping element) and is thus not discussed here in full for brevity.

In the following, it is, first, assumed that the signal processing element 406 is a signal reconstruction element. Accordingly, the received digital signal y (approximating or simulating a received analog signal) is reconstructed, by the signal reconstruction element 406, with a resolution higher than the resolution of the second combined digital signal ỹ (e.g., with a resolution of 8 or 12 bits) based on the second combined digital signal ỹ.

To enable the training of the machine-learning algorithm 404, a value of a loss function is calculated in element 407. The loss function takes as its input the received digital signal y and a reconstructed received digital signal (i.e., the output of the signal reconstruction element 406). The loss function may be calculated over a pre-defined time window (i.e., over a pre-defined number of consecutive samples of y and ŷ). The pre-defined time window in element 404 may be the same pre-defined time window which is used in the DFE 403.

Specifically, the loss function 407 may be a mean squared error (MSE) function or a normalized mean squared error (NMSE) function. The MSE function may be defined as $$l_{MSE} = \frac{1}{N}\|\hat{y} - \underline{y}\|^2 = \frac{1}{N}\sum_{n=1}^{N}(\hat{y}[n] - \underline{y}[n])^2,$$

where N is the width of the pre-defined time window in samples, $\underline{y}$ and $\hat{y}$ are vectors corresponding to said pre-defined time window (i.e., having length N) and $\|\ldots\|$ is the Euclidean norm. In some alternative embodiments, the loss function may be defined as a sum of squares of errors or a square root thereof, that is, as $$l = \|\hat{y} - \underline{y}\|^2 = \sum_{n=1}^{N}(\hat{y}[n] - \underline{y}[n])^2$$

or $$l = \|\hat{y} - \underline{y}\| = \sqrt{\sum_{n=1}^{N}(\hat{y}[n] - \underline{y}[n])^2}.$$

The NMSE function may be defined as $$l_{NMSE} = \frac{l_{MSE}}{\frac{1}{N}\sum_{n=1}^{N}(\underline{y}[n])^2}.$$

In some embodiments, the total or combined loss may be calculated as an average over loss values calculated for a batch of training sequences (preferably, consecutive training sequences), where each training sequence has a pre-defined length N. In other words, the total loss L may be defined as an average over the values of the loss function for a batch of training sequences according to:

$$L = \frac{1}{B}\sum_{i=1}^{B}l^{(i)},$$

where $l^{(i)}$ is a value of the loss function for a training sequence i and B is the total number of training sequences in the batch. The loss function may be defined here accordingly to any of the definitions given above. For example, the total loss L may be defined as:

$$L_{MSE} = \frac{1}{NB}\sum_{i=1}^{B}\|\hat{y}^{(i)} - \underline{y}^{(i)}\|^2 \text{ or } L_{NMSE} = \frac{1}{B}\sum_{i=1}^{B}\frac{\|\hat{y}^{(i)} - \underline{y}^{(i)}\|^2}{\sum_{n=1}^{N}(\underline{y}^{(i)}[n])^2},$$

where the superscript (i) indicates that the quantity in question relates to a training sequence i. The calculation of the total loss is further discussed in relation to block 705 of FIG. 7.

If the signal processing element 406 is a signal-to-symbol demapping element, the loss function may be defined differently. Specifically, in that case, the loss function may be defined as a binary cross entropy function. Binary cross entropy is commonly used as a loss function when dealing with problems involving yes/no (i.e., binary) decisions. The binary cross entropy function measures how far away from the true value a prediction is. Specifically, binary cross-entropy function provides a measure of the difference between two probability distributions for a given binary random variable (here, corresponding to bits in a transmitted digital signal). The binary cross entropy function (or binary cross entropy loss function) may take as its input a probability of bits produced by the bit-to-symbol demapping of the second combined digital signal having a pre-defined value (i.e., a value of 0 or 1) and a sequence of transmitted bits (corresponding to the received digital signal). The values of the transmitted bits, acting as the target data or the groundtruth in this case, may be known for the used training data (i.e., for received digital signals used in the training), that is, these values may be maintained in a memory. The binary cross entropy function may be, for example, defined as $$BCE = b * \log(P(B=1)) + (1-b) * \log(1 - P(B=1)),$$

where b is the actual value of a transmitted bit (i.e., the groundtruth) and $P(B=1)$ is a probability that a bit produced by the bit-to-symbol demapping of the second combined digital signal and corresponding to said transmitted bit has a value of 1. It should be noted that $P(B=1) = 1 - P(B=0)$. The logarithm in the above equation may have any base (e.g., 2 or 10). Similar to above embodiments, a total loss may be calculated, also here, as an average over loss values calculated for a batch of training sequences, where each training sequence has a pre-defined length N.

The value of the loss function or of the total loss calculated in element 407 is used in training the machine-learning algorithm. Specifically, the machine-learning algorithm is trained by adjusting one or more parameters (i.e., weights) of the machine-learning algorithm (e.g., one or more weights of a neural network) based on the value of the loss function or the total loss (as illustrated by arrow from the element 407 to the element 404 implementing the machine-learning algorithm). The aim of the training is to minimize the value of the loss function. The loss function may be equally called an objective function. The training carried out using the loss function may be specifically based on a stochastic gradient descent (SGD) method. The stochastic gradient descent method may specifically correspond to classical or basic SGD or to any variant or extension thereof. For example, the SGD method used may be one of classic SGD, Adaptive Moment Estimation (ADAM), Root Mean Square Propagation (RMSProp), Kalman-based Stochastic Gradient Descent (kSGD), Implicit updates stochastic gradient descent (ISGD) and Momentum. In other embodiments, the training may be carried out using another gradient descent method such as batch gradient descent, mini-batch gradient descent or gradient descent with momentum.

In some embodiments, a plurality of values of the loss function may be calculated based at least on results of processing of a plurality of second combined digital signals and a corresponding plurality of known target data sets associated with the plurality of received digital signals. The plurality of known target data set may correspond, e.g., to the plurality of received digital signals themselves or to a plurality of sequences of bits associated with the plurality of received digital signals. The plurality of received digital signals may be equally called a batch of received digital signals. Only after the calculation of the plurality of values of the loss function, one or more parameters of the machine-learning algorithm may be adjusted based on the plurality of values of the loss function or on a value of a total loss calculated based on the plurality of values of the loss function (e.g., as an average).

The operation of the system of FIG. 4 (i.e., training of the machine-learning algorithm) described above may be repeated, for example, until one or more pre-defined criteria for the value of the loss function and/or for the number of repetitions are satisfied, as will be described in more detail in relation to block 509 of FIG. 5.

Figure 5:
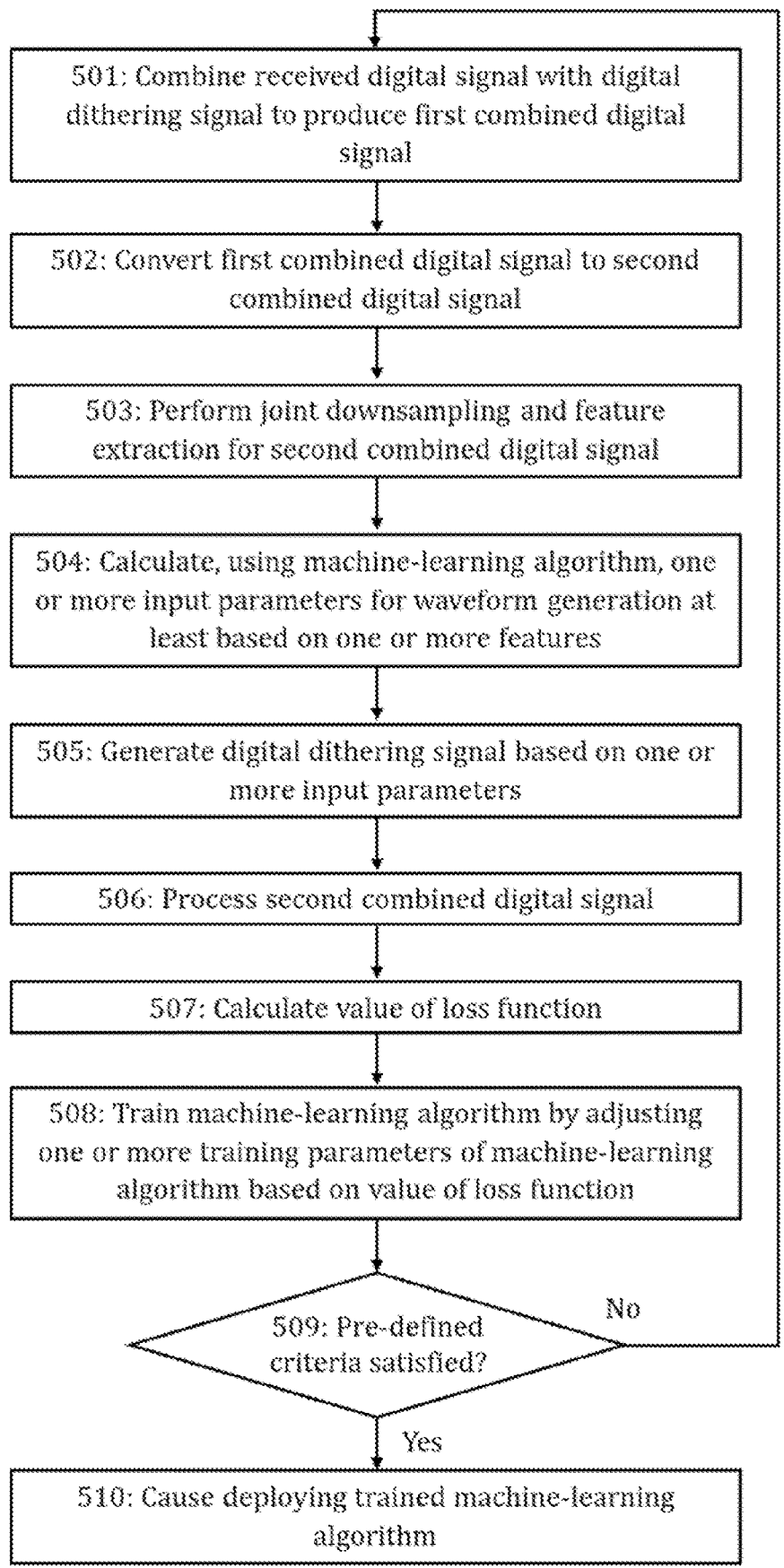

FIG. 5 illustrates a process according to embodiments for training a machine-learning algorithm. The process of FIG. 3A or 3B may be carried out, for example, by the system of FIG. 4. The illustrated process may be carried out by a computing device or a server. Said computing device or server may, in some embodiments, be electrically connected (via a wired or wireless link) to an apparatus carrying out the process described in relation to FIGS. 2 and/or 3 so as to enable sharing the trained machine-learning algorithm. In the following, the entity carrying out process is called simply an apparatus.

Referring to FIG. 5, it may be initially assumed that the machine-learning algorithm (e.g., a neural network) has been initialized with certain initial values (e.g., random and/or pre-defined values) for one or more parameters (or weights) of the machine-learning algorithm or that some training has already carried out. The apparatus combines, in block 501, a received digital signal with a digital dithering signal to produce a first combined digital signal. The apparatus may maintain said received digital signal (or a plurality of received digital signals comprising said received digital signal) acting as training data in a memory of the apparatus. Further information regarding said received digital signal (e.g., bits included in a corresponding transmitted signal, i.e., bits acquired by performing bit-to-symbol demapping on the received digital signal assuming no errors) may also be maintained in said memory. The apparatus applies, in block 502, a differentiable approximation of a quantization operator to the combined digital signal to form a second combined digital signal with a lowered resolution compared to the first combined digital signal. The differentiable approximation of the quantization operator approximates an analog-to-digital converter. The apparatus performs, in block 503, joint downsampling and feature extraction for the second combined digital signal. The apparatus calculates, in block 504, a machine-learning algorithm for calculating one or more input parameters for waveform generation at least based on one or more features extracted from the second combined digital signal. The apparatus generates, in block 505, the digital dithering signal based on the one or more input parameters.

The apparatus processes, in block 506, the second combined digital signal. Specifically, the processing in block 506 may comprise reconstructing the received digital signal with a resolution higher than the resolution of the second combined digital signal based on the second combined digital signal or performing bit-to-symbol demapping on the second combined digital signal. The apparatus calculates, in block 507, a value of a loss function. The loss function may be calculated at least based on the results of the processing and corresponding known target data associated with the received digital signal (e.g., the received digital signal itself or a sequence of bits corresponding to a transmitted signal). Said target data (or a plurality of sets of target data corresponding to a plurality of received digital signals) may be maintained in a memory of the apparatus. If the second combined digital signal is processed, in block 506, by reconstructing the received digital signal with a resolution higher than a resolution of the second combined digital signal based on the second combined digital signal, the loss function may be a mean squared error or normalized mean squared error function calculated between a reconstructed received digital signal and the received digital signal. If the second combined digital signal is processed, in block 506, by performing bit-to-symbol demapping on the second combined digital signal, the loss function may be a binary cross entropy function taking as its input a probability of bits produced by the bit-to-symbol demapping of the second combined digital signal having a pre-defined value (i.e., having a value of 0 or 1) and a sequence of transmitted bits (associated with the received digital signal). Said transmitted bits may be assumed to be known for the training data (i.e., for the received digital signals used in the training). The transmitted bits correspond to a result of performing bit-to-symbol demapping directly on the received digital signal without any errors.

The apparatus trains, in block 508, the machine-learning algorithm by adjusting one or more parameters of the machine-learning algorithm based on the value of the loss function (or on a plurality of values of the loss function). Specifically, the adjusting may be carried out so as to cause reducing of the value of the loss function (e.g., using a stochastic gradient descent method).

The apparatus checks, in block 509 whether one or more pre-defined criteria has been reached (or satisfied). The one or more pre-defined criteria may comprise, for example, one or more pre-defined criteria for the value of the loss function and/or one or more pre-defined criteria for the number of iterations. The one or more pre-defined criteria for the value of the loss function may define that the value of the loss function should to be smaller than a pre-defined lower limit. Alternatively or additionally, the one or more pre-defined criteria for the value of the loss function may define that the value of the loss function should change at least by a pre-defined amount over a pre-defined number of consecutive iterations. In some embodiments, the one or more pre-defined criteria may define that the value of the loss function should be smaller than said pre-defined lower limit for the value of the loss function for two or more consecutive iterations. The one or more pre-defined criteria for the number of iterations may define that the number of iterations should larger than a pre-defined upper limit or threshold.

In response to the one or more pre-defined criteria failing to be satisfied in block 509, the processes described in relation to blocks 501 to 509 may be repeated.

In response to the one or more pre-defined criteria being satisfied in block 509, the apparatus may cause deploying, in block 510, the trained machine-learning algorithm. Said deploying may comprise, for example, causing transmitting information on the trained machine-learning algorithm (at least on the one or more parameters of the machine-learning algorithm which were trained) via a communication network or a wired or wireless communication link to a second apparatus which is to use the trained machine-learning algorithm for receiving analog (RF) signals (e.g., an apparatus of FIG. 2 or any apparatus for performing a method of FIG. 3A or 3B). In other embodiments, block 510 may be omitted and instead the apparatus may simply stop the process and possibly store the trained machine-learning algorithm to a memory (i.e., to an internal and/or external memory).

In some embodiments, the apparatus may repeat the combining (block 501), the applying (block 502), the performing (block 503), the calculating of the one or more input parameters (block 504), the generating (block 505), the processing (block 506) and the calculating of the value of the loss function (block 507) for a batch of training sequences, wherein each training sequence corresponds to a new received digital signal (as described in relation to FIG. 4). Then, the apparatus may perform the training of the machine-learning algorithm, in block 508, by adjusting one or more parameters of the machine-learning algorithm based on a value of total loss calculated as an average over values of the loss function for the batch of training sequences. Alternatively, the apparatus may perform the training of the machine-learning algorithm, in block 508, by adjusting one or more parameters of the machine-learning algorithm based (directly) on values of the loss function for the batch of training sequences (that is, without calculating a value of total loss).

Figure 6A:
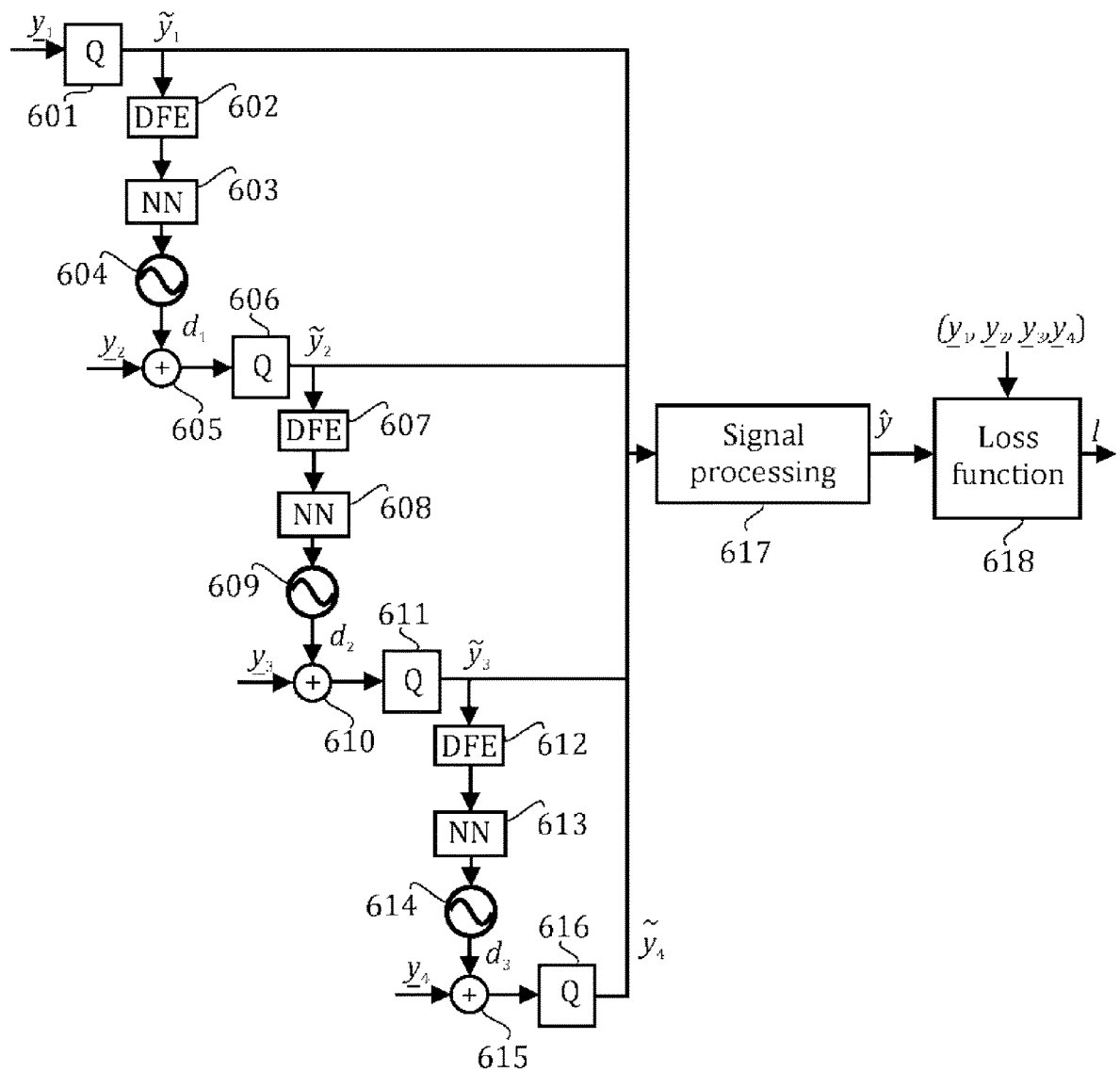
Figure 6B:
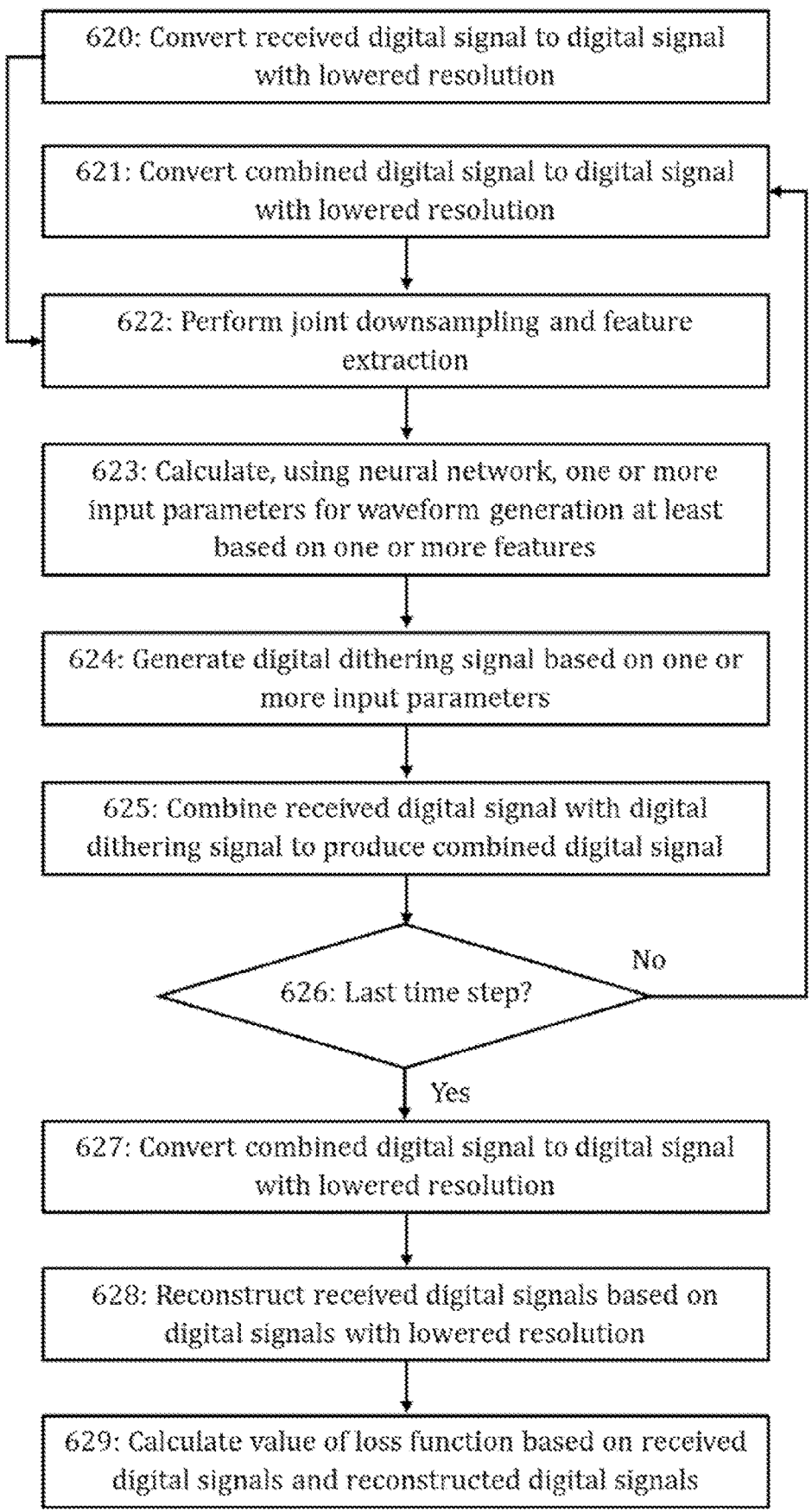

FIG. 6A illustrates a system (or a part of a system) according to embodiments for training a machine-learning algorithm based specifically on an unfolded recurrent neural network. FIG. 6B illustrates a flow chart which may correspond to the process carried out by the system of FIG. 6A. In the following, said two Figures are discussed together for convenience. The system of FIG. 6A may correspond to the system of FIG. 4 where the element 404 corresponds to a recurrent neural network which has been unfolded or unrolled specifically with four time steps. FIG. 6B illustrates a more general case where the number of time steps used in the unfolding may be any integer larger than or equal to one. The illustrated system may correspond to or be comprised in a receiver or a transceiver. The illustrated system may be comprised in an access or a relay node such as the access or relay node 104 of FIG. 1 or in a terminal device such as either of the terminal devices 100, 102. The illustrated system may be implemented in a computing device comprising at least one processor and at least one memory.

As mentioned above, unfolding in time using four time steps has been implemented in FIG. 6A for the recurrent neural network, that is, the feedback loop involving the recurrent neural network has been replaced by four feedback loops involving a feedforward neural network or, to be precise, multiple copies 603, 607, 611 of the same feedforward neural network. A key feature in the unfolding is that the recurrent neural network does not change between the unfolded time steps. Specifically, the same weights (i.e., same parameters) and the same topology are used for each time step (i.e., for each element 603, 607, 611). In this way, the whole neural network (its topology and weights) is effectively copied for each time step in the input sequence (i.e., here for each time step of the four time steps).

Referring to both FIGS. 6A and 6B, the first time step in the unfolding (illustrated with elements 601 to 604 and blocks 620 to 624) is treated a little differently compared to the proceeding time steps. In the first time step, a differentiable approximation of the quantization operator (denoted with Q in FIG. 6A for brevity) is, first applied, in element 601 and block 710, to a received digital signal $y_1$ (e.g., sampled from measurements) to form a digital signal $\tilde{y}_1$ with a lowered resolution compared to the received digital signal $y_1$. In other words, a high-resolution digital signal approximating an analog signal is converted into a low-resolution digital signal (e.g., a one-bit digital signal) to be used later in reconstructing the high-resolution digital signal. Notably, the received digital signal $y_1$ in the first time step is not combined with a digital dithering signal (as no digital dithering signal has been yet calculated). Then, the digital signal $\tilde{y}_1$ with lowered resolution is processed by performing joint downsampling and feature extraction, in element 602 and block 622, and the resulting one or more extracted features are used by the neural network 603, in block 623, for calculating one or more first input parameters for waveform generation. A first digital dithering signal $d_1$ is calculated in element 604 based on the one or more first input parameters.

In the second time step (corresponding to elements 605 to 609 and blocks 625, 626, 621 to 624), this first digital dithering signal $d_1$ is combined with a second received digital signal $y_2$ and the resulting combined digital signal is reduced using the differentiable approximation of the quantization operator 606 (block 621) to a second digital signal $\widetilde{y_2}$ with a lowered resolution.

The second time step and the following third time step (corresponding to elements 610 to 614 and blocks 625, 626, 621 to 624) correspond to repeating the feedback loop as discussed in relation to elements 401 to 405 of FIG. 4 and blocks 502 to 505 of FIG. 5 with a different received digital signal ($y_2$ and $y_3$, respectively, in the exemplary system of FIG. 6A) and are thus not discussed here in full for brevity. At least some of these processes may be carried out in parallel with each other. In the general case where the number of time steps may be other than four, the same principle applies for any time steps between the first time step and the last time step, as is illustrated in FIG. 6B or more specifically in blocks 625, 626, 621 to 624 therein.

The final time step (corresponding to elements 615, 616 and blocks 625 to 627) is again treated a little differently compared to the preceding time steps. The final time step does not involve carrying out the whole feedback loop but merely combining, in element 615 and block 625, a received digital signal $y_4$ with a (third) digital dithering signal $d_3$ and reducing, in element 616 and block 627, the resulting digital signal using the differentiable approximation of the quantization operator 616 to a digital signal $\hat{y}_4$ with a lowered resolution. In FIG. 6B, it is explicitly checked, in block 626, whether the current time step is the last time step in the unfolding before proceeding to block 627.

In FIGS. 6A and 6B, all the received digital signals used as inputs ($y_1$, $y_2$, $y_3$ and $y_4$ in FIG. 6A) may have the same length in samples. Further, all the received digital signals may correspond to consecutive sets of samples.

Apart from the unfolding described above, the elements of the system of FIG. 6A may correspond to corresponding elements of FIG. 4. Namely, the DFE elements 602, 607, 612 may correspond to the DFE element 403 of FIG. 4, waveform generation elements 604, 609, 614 may correspond to the waveform generation element 405 and the combining elements 605, 610, 615 may correspond to the combining element 401. The same applies for corresponding blocks of FIG. 6B and blocks of FIG. 5.

The signal processing and loss function elements 617, 618 in FIG. 6A (corresponding to blocks 628, 629 of FIG. 6B, respectively) may also correspond, respectively, to elements 406, 407 of FIG. 4, at least for the most part. The signal processing element 617 takes as its input all low-resolution (e.g., one-bit) digital signals $\widetilde{y_1}$ $\widetilde{y_2}$, $\widetilde{y_3}$ and $\hat{y}_4$, instead of just one low-resolution digital signal. The signal processing (i.e., signal reconstruction or bit-to-symbol demapping) may be carried out separately for each of $\widetilde{y_1}$ $\widetilde{y_2}$, $\widetilde{y_3}$ and $\hat{y}_4$ or it may be carried out for a single digital signal corresponding to a concatenation of the low-resolution (e.g., one-bit) digital signals $\widetilde{y_1}$, $\widetilde{y_2}$, $\widetilde{y_3}$ and $\hat{y}_4$.

Correspondingly, the loss function 618 takes as its input all of the four received digital signals $y_1$, $y_2$, $y_3$ and $y_4$ as well as the corresponding four reconstructed digital signals or the corresponding bit sequences (not shown in FIG. 6A). A single value of the loss function 618 may be calculated based on said inputs. Said single value may be calculated, for example, by calculating a value of a loss function for each time step separately and taking an average over said values of the loss function. This single value of the loss function may be used for training all of the copies 603, 608, 613 of the neural network, as will be discussed in more detail in relation to FIG. 7.

It should be noted that that the processing of the digital signals $\widetilde{y_1}$, $\widetilde{y_2}$, $\widetilde{y_3}$ and $\hat{y}_4$ and the calculation of the total loss in blocks 628, 629 of the exemplary embodiment of FIG. 6B correspond specifically to reconstructing received digital signals (as opposed to performing bit-to-symbol demapping) and calculating the total loss based there on. Obviously, bit-to-symbol demapping could, alternatively, be carried out in connection with this embodiment (as discussed above).

As mentioned above, the neural networks 603, 608, 614 may be feedforward neural networks (i.e., copies of the same feedforward neural network). In some alternative embodiments (not shown in FIG. 6A), the copies 603, 608, 614 of the neural network may be copies of a recurrent neural network in which case each copy 603, 608, 614 in the feedback loop has an internal state. In such embodiments, this internal state may be propagated through time between consecutive copies of the recurrent neural network. In other words, a second copy 608 of the recurrent neural network is aware of the state of the first copy 603 of the recurrent neural network and may take it into account in calculating the one or more input parameters for waveform generation (and the same applies for each pair of consecutive copies of neural networks).

It should be noted that FIG. 6A illustrates unfolding with specifically four time steps merely as an example with four being chosen for the number of time steps mostly for simplicity of presentation. In practical embodiments, a larger number of time steps may be used. In general, any other positive integer number of time steps may be used in other embodiments. In some embodiments, the number of time steps used in the unfolding may be ten or more.

Figure 7:
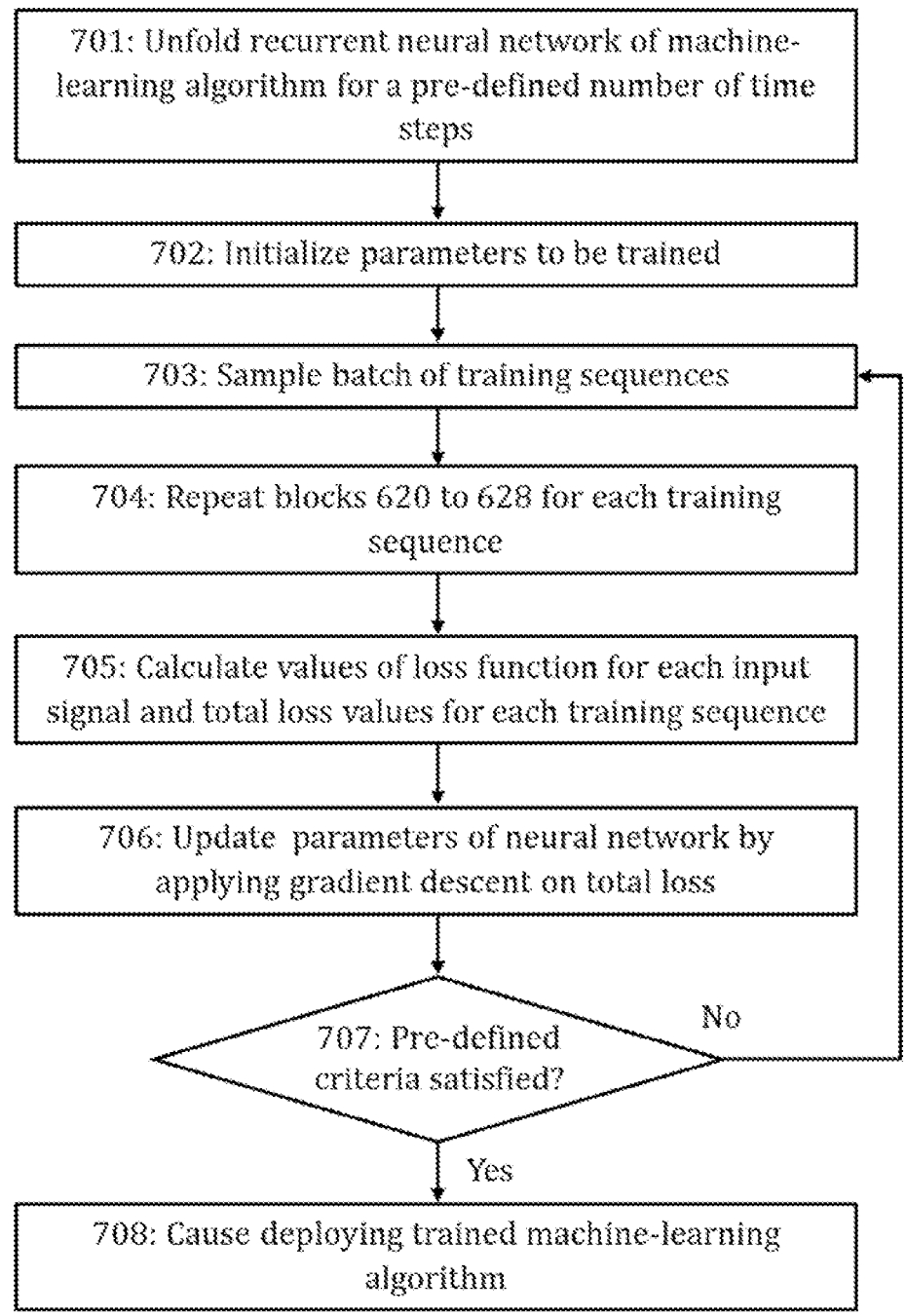

FIG. 7 illustrate a process according to embodiments for training a machine-learning algorithm based on a recurrent neural network using unfolding in time. The process illustrated with FIG. 7 may be based on the architecture illustrated in FIG. 6A. The illustrated process may, thus, be carried out by a computing device or a server. Said computing device or server may, in some embodiments, be electrically connected (via a wired or wireless link) to an apparatus carrying out the process described in relation to FIGS. 2, 3A and/or 3B so as to enable sharing the trained machine-learning algorithm. In the following, the entity carrying out process is called simply an apparatus. Moreover, in the following it is assumed that the reconstructing of the received digital signals is carried out and the loss function is defined accordingly (e.g., as a RMS function). In other embodiments, bit-to-symbol demapping may be employed and the loss function may be defined accordingly, for example, as a SGD function.

Referring to FIG. 7, the apparatus unfolds, in block 701, a recurrent neural network of the machine-learning algorithm for a pre-defined number of time steps. For example, the recurrent neural network may be unfolded using four time steps so as to end up with the architecture illustrated in FIG. 6. In general, the pre-defined number of time steps may be equal to any integer larger than or equal to two.

The apparatus initializes, in block 702, the (unfolded) recurrent neural network. The initializing may comprise, for example, assigning one or more random values and/or one or more pre-defined values for the parameters (or weights)

of the neural network. The same values may be assigned to each copy of the neural network involved in the unfolding.

The apparatus samples, in block 703, a batch of RF signal time sequences to be used for training (equally called a batch of training sequences or a batch of received digital signals). The sampling may be carried out from a (larger) set of RF time sequences maintained in a memory of the apparatus. The batch may have a batch size of B and each training sequence in the batch B may have a length of T samples. In other words, the sampling in block 703 may comprise sampling a batch $\{\underline{y}^{(1)}, \underline{y}^{(2)} \ldots, \underline{y}^{(B)}\}$, where $\underline{y}^{(i)}$ denotes the ith training sequence defined as $\underline{y}^{(i)} = \{\underline{y}_1^{(i)}, \ldots, \underline{y}_T^{(i)}\}$ with i=1, 2, ..., B. The batch size B may be an integer equal to or larger than one. Each individual digital input signal $\underline{y}_1^{(i)}, \ldots, \underline{y}_T^{(i)}$ in the training sequence may comprise the same pre-defined number of samples.

The apparatus performs, in block 704, calculations using unfolded recurrent neural network according to blocks 620 to 628 so as to form sets of reconstructed digital signals $\{\{\hat{\underline{y}}_1^{(1)}, \ldots \hat{\underline{t}}_T^{(1)}\}; \{\hat{\underline{y}}_1^{(2)}, \ldots, \hat{\underline{y}}_T^{(2)}\}; \ldots; \{\hat{\underline{y}}_1^{(B)}, \ldots, \hat{\underline{y}}_T^{(B)}\}\}$ corresponding to sets of digital input signals $\{\{\underline{y}_1^{(1)}, \ldots, \underline{y}_T^{(1)}\}; \{\underline{y}_1^{(2)}, \ldots, \underline{y}_T^{(2)}\}; \ldots; \{\underline{y}_1^{(B)}, \ldots, \underline{y}_T^{(B)}\}\}$, respectively. Specifically, the apparatus repeats actions pertaining to blocks 620 to 628 for each training sequence in the batch. Said repeating may be carried out, fully or partly, in parallel for different training sequences in the batch.

Then, the apparatus calculates, in block 705, a set of values of the loss function for each of the training sequences in the batch and a value of total loss based on each set of values of the loss function for each training sequence. In other words, values of the loss function $l^{(1)}, l^{(2)}, \ldots, l^{(B)}$ for each training sequence are, first, derived based on the sets of digital input signals $\{\{\underline{y}_1^{(1)}, \ldots, \underline{y}_T^{(1)}\}; \{\underline{y}_1^{(2)}, \ldots, \underline{y}_T^{(2)}\}; \ldots; \{\underline{y}_1^{(B)}, \ldots, \underline{y}_T^{(B)}\}\}$ and the sets of reconstructed digital signals $\{\{\hat{\underline{y}}_1^{(1)}, \ldots, \vec{\underline{y}}_T^{(1)}\}; \{\vec{\underline{y}}_1^{(2)}, \ldots, \hat{\underline{y}}_T^{(2)}\}; \ldots; \{\hat{\underline{y}}_1^{(B)}, \ldots \hat{\underline{y}}_T^{(B)}\}\}$, respectively. The total loss L may be defined as an average over the calculated values of the loss function for the batch B, that is, according to:

$$L = \frac{1}{B}\sum_{i=1}^{B} l^{(i)}.$$

The loss function may be defined according to any of the definitions provided in relation to above embodiments for the loss function. For example, the following definition may be used:

$$l^{(i)} = \|\underline{y}^{(i)} - \hat{y}^{(i)}\|.$$

The apparatus updates, in block 706, the parameters (or weights) of the neural network (i.e., in each copy of the neural network) by applying one step of stochastic gradient descent (SGD) on the total loss L for the batch B. The gradient descent is a first-order iterative optimization algorithm used to minimize a function by iteratively moving in the direction of steepest descent as defined by the negative of the gradient. The stochastic gradient descent is a stochastic approximation of the gradient descent optimization. The stochastic gradient descent method used here may correspond to classical or basic SGD or to any variant or extension thereof, for example, it may be one of basic SGD, Adaptive Moment Estimation (ADAM), Root Mean Square Propagation (RMSProp), Kalman-based Stochastic Gradient Descent (kSGD), Implicit updates stochastic gradient descent (ISGD) and Momentum. In other embodiments, a gradient descent method other than SGD may be employed, as described in relation to block 407 of FIG. 4.

The apparatus checks, in block 707, whether one or more pre-defined criteria for the training have been satistified. The one or more pre-defined criteria may define one or more pre-defined criteria for the total loss (e.g., a pre-defined lower limit defining highest acceptable total loss and/or a pre-defined lower limit defining a highest acceptable change or increase in the total loss during a pre-defined number of iterations) and/or one or more pre-defined criteria for the number of iterations (e.g., a pre-defined upper limit to be exceeded). If the one or more pre-defined criteria are not satisfied, the process of blocks 703 to 707 is repeated. If the one or more pre-defined criteria are satisfied, the process either simply ends (not shown in FIG. 7) or the apparatus causes, in block 708, deployment of the trained machine-learning algorithm (i.e., deployment of the trained neural network), similar to as described in relation to block 510 of FIG. 5.

In some embodiments, the batch size B and/or learning rate may be adjusted during the training.

Figure 8:
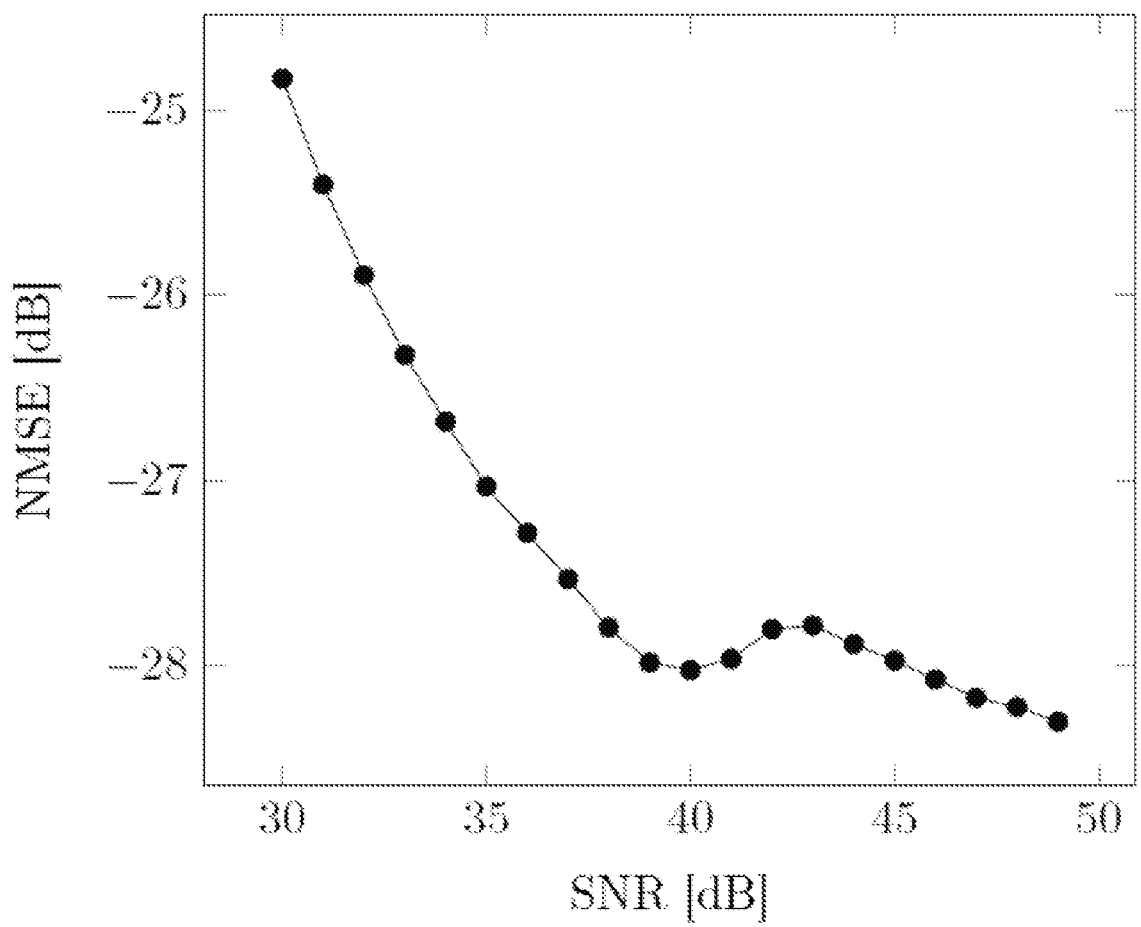
FIG. 8 illustrates normalized mean squared error (NMSE) in signal reconstruction achieved with a system according to embodiments as a function of signal-to-noise ratio (SNR)

FIG. 8 shows NMSE as a function of the signal-to-noise ratio (SNR) in decibels when using a trained machine-learning algorithm with the apparatus according to embodiments (or specifically according to FIG. 4). In this particular example, a 16-QAM (Quadrature Amplitude Modulation) modulated OFDM (Orthogonal Frequency Division Multiplexing) signal is transmitted over an AWGN (Additive White Gaussian Noise) channel with one-bit quantization at the receiver, and an oversampling factor of 800. The SNR is defined as the ratio between the average energy per constellation symbol and the noise power spectral density. The dithering signal is a simple sine waveform and only the amplitude is controlled. The quality of the signal reconstruction was measured by the NMSE, defined as $$NMSE = \frac{\|\underline{y} - \hat{y}\|^2}{\|\underline{y}\|^2}.$$

In other words, the NMSE is the normalized reconstruction error (i.e., the reconstruction error normalized to the input signal). From FIG. 8, it can be observed that the use of the system according embodiments leads to a very low NMSE, i.e., to a high quality signal reconstruction despite the one-bit quantization. If the system according embodiments would not be used, the NMSE would be approximately 20 dB worse in the example of FIG. 8.

The blocks, related functions, and information exchanges described above by means of FIGS. 2, 3A, 3B, 4, 5, 6A, 6B and 7 in no absolute chronological order, and some of them may be performed simultaneously or in an order differing from the given one. Other functions can also be executed between them or within them, and other information may be sent and/or received, and/or other mapping rules applied. Some of the blocks or part of the blocks or one or more pieces of information can also be left out or replaced by a corresponding block or part of the block or one or more pieces of information.

Figure 9:
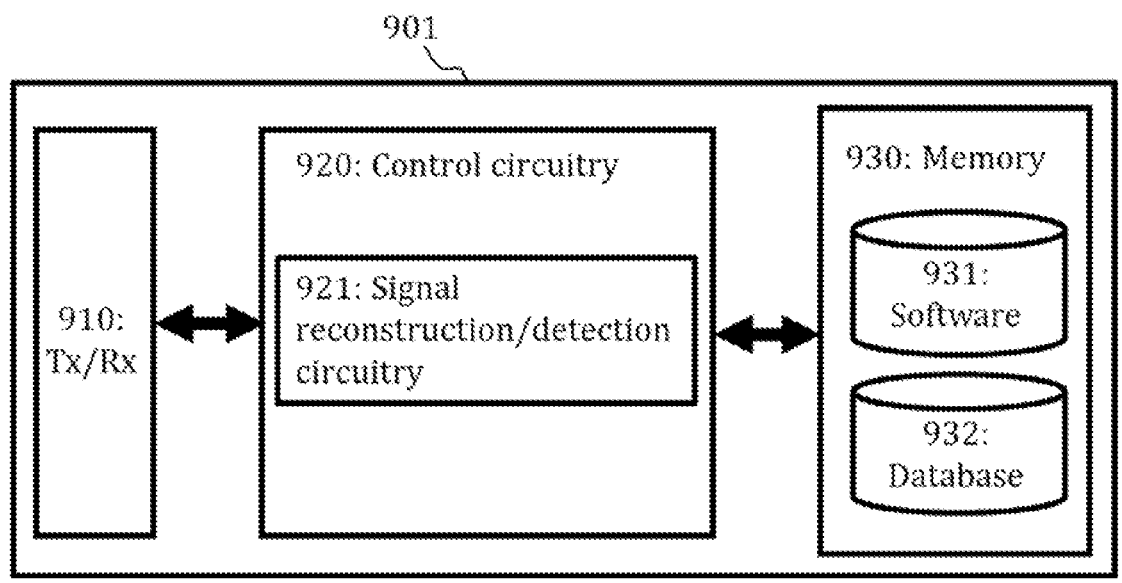
FIGS. 9 and 10 illustrate apparatuses according to embodiments.

FIG. 9 provides a computing device 901 (or alternatively an apparatus or a network element or node) according to some embodiments. FIG. 9 may illustrate a computing device configured to carry out at least the functions described above in connection with reconstructing received signals based on one-bit or other low-resolution analog-to-digital converters. The computing device 901 may correspond to a receiver or a transceiver or subunit therein. The computing device may correspond to any of elements 100, 102, 104 of FIG. 1 or a (sub)element within any of elements 100, 102 104 of FIG. 1. The computing device 901 may comprise one or more control circuitry 920, such as at least one processor, and at least one memory 930, including one or more algorithms 931, such as a computer program code (software) wherein the at least one memory and the computer program code (software) are configured, with the at least one processor, to cause, respectively, the computing device to carry out any one of the exemplified functionalities of the computing device described above.

Referring to FIG. 9, the control circuitry 920 of the computing device 901 comprises at least signal reconstruction/detection circuitry 921. The signal reconstruction/detection circuitry 921 may be configured to carry out signal reconstruction or detection according to embodiments and, to this end, to carry out at least some of the functionalities described above by means of any of FIGS. 2, 3A and 3B using one or more individual circuitries. Specifically, the signal reconstruction/detection circuitry 921 may be configured to carry out actions pertaining to (digital) elements 206 to 208, 209 of FIG. 2 and/or actions described in relation to blocks 303 to 306 of FIG. 3A and/or blocks 313 to 316 of FIG. 3B.

The memory 930 may comprise a database 932 which may comprise, for example, information on the trained machine-learning algorithm (e.g., parameters and topology), low-resolution digital signals and reconstructed (high-resolution) digital signals. The memory 930 may also comprise other databases which may not be related to the functionalities of the computing device according to any of presented embodiments. The memory 930 may be implemented using any suitable data storage technology, such as semiconductor based memory devices, flash memory, magnetic memory devices and systems, optical memory devices and systems, fixed memory and removable memory.

Referring to FIG. 9, the computing device may further comprise different interfaces 910 such as one or more communication interfaces (TX/RX) comprising hardware and/or software for realizing communication connectivity over one or more transmission media according to one or more communication protocols. Specifically, the communication interface 910 for a computing device (e.g., a receiver or a transceiver) may provide the computing device with communication capabilities to communicate in a wireless communication system and enable communication with one or more access nodes, one or more terminal devices (possibly via said plurality of access nodes) and/or one or more other network nodes or elements. The communication interface may comprise standard well-known components such as an amplifier, (bandpass) filter, frequency-converter, (one-bit) analog-to-digital converts, (de)modulator, and encoder/decoder circuitries, controlled by the corresponding controlling units, and one or more antennas. The communication interface may also comprise an analog combiner. The computing device may also comprise different user interfaces.

Figure 10:
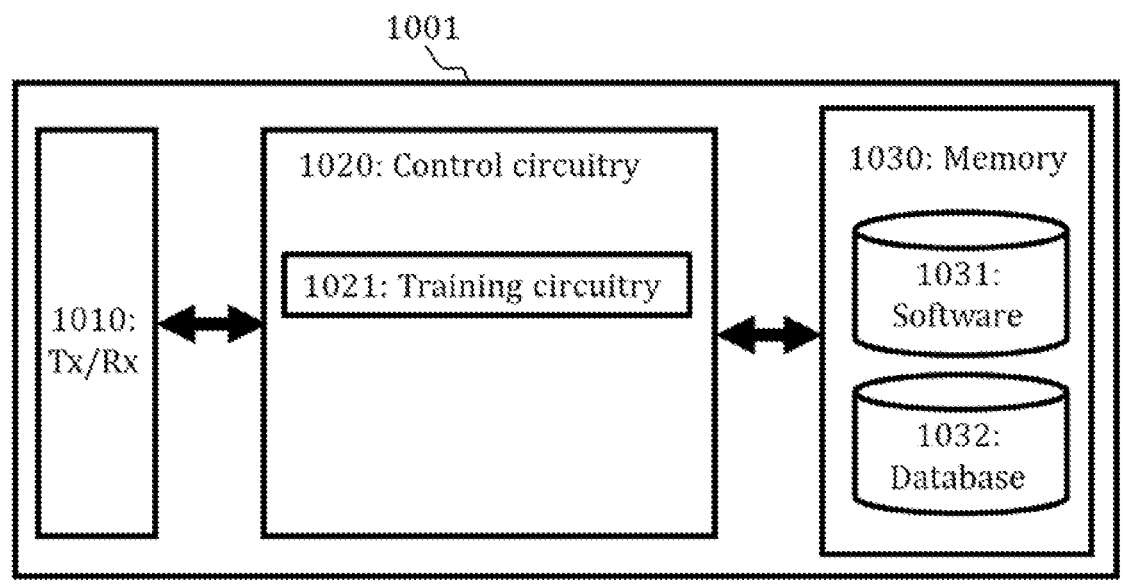

FIG. 10 provides a computing device 1001 (or alternatively an apparatus or a network element or node) according to some embodiments. FIG. 10 may illustrate a computing device configured to carry out at least the functions described above in connection with training a machine-learning algorithm (e.g., neural network-based algorithm) for dithering signal generation so as to enable reconstructing received signals based on one-bit or other low-resolution analog-to-digital converters. The computing device 1001 may correspond to a receiver or a transceiver or subunit therein. The computing device may correspond to any of elements 100, 102, 104, 108, 112 of FIG. 1 or a (sub)element within any of elements 100, 102, 104, 108, 112 of FIG. 1. The computing device 1001 may comprise one or more control circuitry 1020, such as at least one processor, and at least one memory 1030, including one or more algorithms 1031, such as a computer program code (software) wherein the at least one memory and the computer program code (software) are configured, with the at least one processor, to cause, respectively, the computing device to carry out any one of the exemplified functionalities of the (training) computing device described above.

Referring to FIG. 10, the control circuitry 1020 of the computing device comprises at least training circuitry 1021. The training circuitry 1021 may be configured to carry out signal training of the machine-learning algorithm (e.g., of a neural network) according to embodiments and, to this end, to carry out at least some of the functionalities described above by means of any of FIGS. 4, 5, 6A, 6B and 7 using one or more individual circuitries.

The memory 1030 may comprise a database 1032 which may comprise, for example, information on RF signal time sequences to be used for training, the machine-learning algorithm (e.g., parameters and topology of a neural network), low-resolution digital signals, reconstructed (high-resolution) digital signals, bit sequences derived by performing bit-to-symbol demapping, bit sequences corresponding to received digital signals for use in training, values of loss function and/or values of total loss per batch. The memory 1030 may also comprise other databases which may not be related to the functionalities of the computing device according to any of presented embodiments. The memory 1030 may be implemented using any suitable data storage technology, such as semiconductor based memory devices, flash memory, magnetic memory devices and systems, optical memory devices and systems, fixed memory and removable memory.

Referring to FIG. 10, the computing device 1001 may further comprise different interfaces 1010 such as one or more communication interfaces (TX/RX) comprising hardware and/or software for realizing communication connectivity over one or more transmission media according to one or more communication protocols. Specifically, the communication interface 1010 for a computing device 1001 may provide the computing device with communication capabilities to communicate in a wireless communication system and enable communication with one or more access nodes, one or more terminal devices (possibly via said plurality of access nodes) and/or one or more other network nodes or elements. The communication interface 1010 may enable the computing device 1001 to transfer a fully trained machine-learning algorithm to a computing device for performing the signal reconstruction and/or the bit-to-symbol demapping using said trained machine-learning algorithm (e.g., a computing device 901 of FIG. 9). The communication interface may comprise standard well-known components such as an amplifier, filter, frequency-converter, analog-to-digital converts, (de)modulator, and encoder/decoder circuitries, controlled by the corresponding controlling units, and one or more antennas. The computing device may also comprise different user interfaces.

As used in this application, the term 'circuitry' may refer to one or more or all of the following: (a) hardware-only circuit implementations, such as implementations in only analog and/or digital circuitry, and (b) combinations of hardware circuits and software (and/or firmware), such as (as applicable): (i) a combination of analog and/or digital hardware circuit(s) with software/firmware and (ii) any portions of hardware processor(s) with software, including digital signal processor(s), software, and memory(ies) that work together to cause an apparatus, such as a terminal device or an access node, to perform various functions, and (c) hardware circuit(s) and processor(s), such as a microprocessor(s) or a portion of a microprocessor(s), that requires software (e.g. firmware) for operation, but the software may not be present when it is not needed for operation. This definition of 'circuitry' applies to all uses of this term in this application, including any claims. As a further example, as used in this application, the term 'circuitry' also covers an implementation of merely a hardware circuit or processor (or multiple processors) or a portion of a hardware circuit or processor and its (or their) accompanying software and/or firmware. The term 'circuitry' also covers, for example and if applicable to the particular claim element, a baseband integrated circuit for an access node or a terminal device or other computing or network device.

In embodiments, the at least one processor, the memory, and the computer program code form processing means or comprises one or more computer program code portions for carrying out one or more operations according to any one of the embodiments of FIGS. 2, 3A, 3B, 4, 5, 6A, 6B and 7 or operations thereof.

In an embodiment, at least some of the processes described in connection with FIGS. 2, 3A, 3B, 4, 5, 6A, 6B and 7 may be carried out by an apparatus comprising corresponding means for carrying out at least some of the described processes. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry. In an embodiment, the at least one processor, the memory, and the computer program code form processing means or comprises one or more computer program code portions for carrying out one or more operations according to any one of the embodiments of FIGS. 2, 3A, 3B, 4, 5, 6A, 6B and 7 or operations thereof.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chipset (procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments as described above may also be carried out, at least in part, in the form of a computer process defined by a computer program or portions thereof. Embodiments of the methods described in connection with FIGS. 2, 3A, 3B, 4, 5, 6A, 6B and 7 may be carried out, at least in part, by executing at least one portion of a computer program comprising corresponding instructions. The computer program may be provided as a computer readable medium comprising program instructions stored thereon or as a non-transitory computer readable medium comprising program instructions stored thereon. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Even though the invention has been described above with reference to examples according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. An apparatus, comprising:
a combiner for combining a received analog signal with an analog dithering signal to produce a combined analog signal, wherein the analog dithering signal is a sine wave or a combination of two or more sine waves;
a one-bit analog-to-digital converter for converting the combined analog signal to a combined digital signal;
means for performing joint downsampling and feature extraction for the combined digital signal;
means for implementing a trained machine-learning algorithm for calculating one or more input parameters for waveform generation at least based on one or more features extracted from the combined digital signal, wherein the one or more input parameters comprise at least an amplitude of at least one sine wave of the analog dithering signal;
a parametric waveform generator for generating the analog dithering signal based on the one or more input parameters; and
means for processing the combined digital signal by performing at least one of:
reconstructing the received analog signal as a digital signal having a higher resolution than the combined digital signal by applying at least one digital bandpass filter to the combined digital signal and performing bit-to-symbol demapping on the combined digital signal.

2. The apparatus according to claim 1, wherein the one or more features comprise one or more of:
a number of zero-to-one transitions in the combined digital signal;
a number of one-to-zero transitions in the combined digital signal;
a ratio of zero-to-one and one-to-zero transitions in the combined digital signal;
a difference between the number of zero-to-one transitions and the number of zero-to-one transitions in the combined digital signal;
a second order moment of the combined digital signal;
noise energy in the combined digital signal; and
energy in the combined digital signal resulting from interference on adjacent channels.

3. The apparatus according to claim 1, wherein the trained machine-learning algorithm has been trained for optimizing the performing of said at least one of the reconstructing of the received analog signal and the performing of the bit-to-symbol demapping.

4. The apparatus according to claim 1, wherein the means for performing the joint downsampling and feature extraction, the means for the implementing and the means for the processing comprise:
at least one processor; and
at least one memory including computer program code, said at least one memory and computer program code configured to, with said at least one processor, cause the performing of the joint downsampling and feature extraction, the implementing and the processing.

5. An apparatus comprising means for performing:
combining a received digital signal with a digital dithering signal to produce a first combined digital signal, wherein the digital dithering signal is a digital approximation of a sine wave or of a combination of two or more sine waves;
applying a differentiable approximation of a quantization operator to the first combined digital signal to form a second combined digital signal, wherein the differentiable approximation of the quantization operator approximates a one-bit analog-to-digital converter in digital domain;
performing joint downsampling and feature extraction for the second combined digital signal;
calculating, using a machine-learning algorithm, one or more input parameters for waveform generation at least based on one or more features extracted from the second combined digital signal, wherein the one or more input parameters comprise at least an amplitude of at least one sine wave of the digital dithering signal;
generating the digital dithering signal based on the one or more input parameters;
processing the second combined digital signal by reconstructing the received digital signal with a resolution higher than a resolution of the second combined digital signal by applying at least one digital bandpass filter to the second combined digital signal or by performing bit-to-symbol demapping on the second combined digital signal;
calculating a value of a loss function based at least on results of the processing of the second combined digital signal and corresponding known target data associated with the received digital signal; and
training the machine-learning algorithm by adjusting one or more parameters of the machine-learning algorithm based at least on the value of the loss function.

6. The apparatus according to claim 5, wherein the machine-learning algorithm is implemented and trained as a recurrent neural network employing unfolding in time for a pre-defined number of time steps.

7. The apparatus according to claim 5, wherein the adjusting of the one or more parameters of the machine-learning algorithm based on the value of the loss function is performed using one of stochastic gradient descent, Adaptive Moment Estimation, Root Mean Square Propagation, Kalman-based stochastic gradient descent, implicit updates stochastic gradient descent, stochastic gradient descent with momentum, batch gradient descent, mini-batch gradient descent and gradient descent with momentum.

8. The apparatus according to claim 5, wherein the received digital signal was formed signal so as to approximate an analog signal by sampling a received analog signal with a Nyquist rate and a resolution of 8 bits or higher or by sampling a received analog signal with a rate higher than the Nyquist rate and a resolution of 8 bits or higher and numerically augmenting a resulting sampled digital, the digital dithering signal having the same resolution and the same sampling rate as the received digital signal.

9. The apparatus according to claim 5, wherein the differentiable approximation of the quantization operator approximates the operation of the one-bit analog-to-digital converter by implementing a function approximating a signum function.

10. The apparatus according to claim 5, wherein the second combined digital signal is processed by performing said reconstructing and the loss function is one of a mean squared error function and a normalized mean squared error function calculated between a reconstructed received digital signal and the received digital signal or
the second combined digital signal is processed by performing said bit-to-symbol demapping and the loss function is a binary cross entropy function taking as its inputs a probability of bits produced by the bit-to-symbol demapping of the second combined digital signal having a pre-defined value and a sequence of transmitted bits corresponding to the received digital signal.

11. The apparatus according to claim 5, wherein the one or more features comprise one or more of:
a number of zero-to-one transitions;
a number of one-to-zero transitions;
a ratio of zero-to-one and one-to-zero transitions;
a difference between the number of zero-to-one transitions and the number of zero-to-one transitions;
a second order moment of the second combined digital signal;
noise energy in the second combined digital signal; and
energy resulting from interference on adjacent channels.

12. The apparatus according to claim 5, wherein the means are further configured to perform:
repeating the combining, the applying, the performing, the calculating of the one or more input parameters, the generating, the processing and the calculating of the value of the loss function for a batch of training sequences, wherein each training sequence corresponds to a new received digital signal; and
performing the training of the machine-learning algorithm by adjusting one or more parameters of the machine-learning algorithm based on values of the loss function for the batch of training sequences or on a value of total loss calculated as an average over the values of the loss function for the batch of training sequences.

13. The apparatus according to claim 5, wherein the means are configured to repeat the performance of the apparatus until one or more pre-defined criteria for the value of the loss function or for a number of iterations has been reached.

14. The apparatus according to claim 5, wherein the means comprise:
at least one processor; and
at least one memory including computer program code, said at least one memory and computer program code configured to, with said at least one processor, cause the performing of the apparatus.

15. The apparatus according to claim 5, wherein the means are further configured to perform:
causing deploying of the trained machine-learning algorithm for use by another apparatus configured to receive analog signals, said another apparatus comprising
at least one processor; and
at least one memory including computer program code, said at least one memory and computer program code configured to, with said at least one processor, cause the another apparatus to perform
joint downsampling and feature extraction for the second combined digital signal;
implementing a trained machine-learning algorithm for calculating one or more input parameters for waveform generation at least based on one or more features extracted from the second combined digital signal, wherein the one or more input parameters comprise at least an amplitude of at least one sine wave of an analog dithering signal;
generating the analog dithering signal based on the one or more input parameters; and
processing the second combined digital signal by performing at least one of:
reconstructing the received analog signals as a digital signal having a higher resolution than the second combined digital signal by applying at least one digital bandpass filter to the second combined digital signal and
performing bit-to-symbol demapping on the second combined digital signal.

16. The apparatus according to claim 1, wherein the trained machine-learning algorithm was trained by another apparatus comprising
at least one processor; and
at least one memory including computer program code, said at least one memory and computer program code configured to, with said at least one processor, cause the another apparatus to perform
applying a differentiable approximation of a quantization operator to the combined digital signal to form a second combined digital signal, wherein the differentiable approximation of the quantization operator approximates a one-bit analog-to-digital converter in digital domain;
performing joint downsampling and feature extraction for the second combined digital signal;
calculating, using the machine-learning algorithm, one or more input parameters for waveform generation at least based on one or more features extracted from the second combined digital signal, wherein the one or more input parameters comprise at least an amplitude of at least one sine wave of a digital dithering signal;
generating the digital dithering signal based on the one or more input parameters;
processing the second combined digital signal by reconstructing the received digital signal with a resolution higher than a resolution of the second combined digital signal by applying at least one digital bandpass filter to the second combined digital signal or by performing bit-to-symbol demapping on the second combined digital signal;
calculating a value of a loss function based at least on results of the processing of the second combined digital signal and corresponding known target data associated with the received digital signal; and
training the machine-learning algorithm by adjusting one or more parameters of the machine-learning algorithm based at least on the value of the loss function.

17. A non-transitory computer-readable medium comprising computer-executable instructions which, when executed in hardware, cause the hardware to perform at least:
downsampling and feature extraction for a combined digital signal, wherein the combined digital signal corresponds to a received analog signal combined with an analog dithering signal and subsequently converted to a digital signal, the analog dithering signal being a sine wave or a combination of two or more sine waves;
calculating, using a trained machine-learning algorithm, one or more input parameters for waveform generation at least based on one or more features extracted from the combined digital signal, wherein the one or more input parameters comprise at least an amplitude of at least one sine wave of the analog dithering signal;
causing generating of the analog dithering signal based on the one or more input parameters; and
processing the combined digital signal by performing at least one of:
reconstructing the received analog signal as a digital signal having a higher resolution than the combined digital signal by applying at least one digital bandpass filter to the combined digital signal and
bit-to-symbol demapping on the combined digital signal.

18. A non-transitory computer-readable medium comprising computer executable instructions which, when executed in hardware, cause the hardware to perform at least:
combining a received digital signal with a digital dithering signal to produce a first combined digital signal, wherein the digital dithering signal is a digital approximation of a sine wave or of a combination of two or more sine waves;
applying a differentiable approximation of a quantization operator to the first combined digital signal to form a second combined digital signal, wherein the differentiable approximation of the quantization operator approximates a one-bit analog-to-digital converter in digital domain;
joint downsampling and feature extraction for the second combined digital signal;
calculating, using a machine-learning algorithm, one or more input parameters for waveform generation at least based on one or more features extracted from the second combined digital signal, wherein the one or more input parameters comprise at least an amplitude of at least one sine wave of the digital dithering signal;
generating the digital dithering signal based on the one or more input parameters;
processing the second combined digital signal by reconstructing the received digital signal with a resolution higher than a resolution of the second combined digital signal by applying at least one digital bandpass filter to the second combined digital signal or by performing bit-to-symbol demapping on the second combined digital signal;

calculating a value of a loss function based at least on results of the processing of the second combined digital signal and corresponding known target data associated with the received digital signal; and training the machine-learning algorithm by adjusting one or more parameters of the machine-learning algorithm based on the value of the loss function.

19. A method, comprising:

combining a received analog signal with an analog dithering signal to produce a combined analog signal, wherein the analog dithering signal is a sine wave or a combination of two or more sine waves;

converting the combined analog signal to a combined digital signal having a one-bit resolution;

performing joint downsampling and feature extraction for the combined digital signal;

calculating, using a machine-learning algorithm, one or more input parameters for waveform generation at least based on one or more features extracted from the combined digital signal, wherein the one or more input parameters comprise at least an amplitude of at least one sine wave of the analog dithering signal;

generating the analog dithering signal based on the one or more input parameters; and processing the combined digital signal by performing at least one of:
  reconstructing the received analog signal as a digital signal having a higher resolution than the combined digital signal by applying at least one digital bandpass filter to the combined digital signal and
  performing bit-to-symbol demapping on the combined digital signal.

20. A method, comprising:

combining a received digital signal with a digital dithering signal to produce a first combined digital signal, wherein the digital dithering signal is a digital approximation of a sine wave or of a combination of two or more sine waves;

applying a differentiable approximation of a quantization operator to the first combined digital signal to form a second combined digital signal, wherein the differentiable approximation of the quantization operator approximates a one-bit analog-to-digital converter in digital domain;

performing joint downsampling and feature extraction for the second combined digital signal;

calculating, using a machine-learning algorithm, one or more input parameters for waveform generation at least based on one or more features extracted from the second combined digital signal, wherein the one or more input parameters for waveform generation comprise at least an amplitude of at least one sine wave of the digital dithering signal;

generating the digital dithering signal based on the one or more input parameters;

processing the second combined digital signal by reconstructing the received digital signal with a resolution higher than a resolution of the second combined digital signal by applying at least one digital bandpass filter to the second combined digital signal or by performing bit-to-symbol demapping on the second combined digital signal;

calculating a value of a loss function based at least on results of the processing of the second combined digital signal and corresponding known target data associated with the received digital signal; and training the machine-learning algorithm by adjusting one or more parameters of the machine-learning algorithm based on the value of the loss function.

\* \* \* \* \*